US012757403B2

(12) United States Patent
Jung et al.

(10) Patent No.: US 12,757,403 B2
(45) Date of Patent: Oct. 6, 2026

(54) SEMICONDUCTOR DEVICE INCLUDING DUMMY STACKED STRUCTURE AND ELECTRONIC SYSTEM INCLUDING THE SAME

(71) Applicant: Samsung Electronics Co., Ltd., Suwon-si (KR)

(72) Inventors: Euntaek Jung, Suwon-si (KR); Sukkang Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 405 days.

(21) Appl. No.: 18/357,401

(22) Filed: Jul. 24, 2023

(65) Prior Publication Data

US 2024/0074203 A1 Feb. 29, 2024

(30) Foreign Application Priority Data

Aug. 29, 2022 (KR) ........................ 10-2022-0108715

(51) Int. Cl.
*H10B 43/50* (2023.01)
*H10B 43/27* (2023.01)

(52) U.S. Cl.
CPC ............. *H10B 43/50* (2023.02); *H10B 43/27* (2023.02)

(58) Field of Classification Search
CPC ........ H10B 43/50; H10B 43/27; H10B 43/40; H10B 41/50; H10B 41/27; H10B 41/40
See application file for complete search history.

(56) References Cited

U.S. PATENT DOCUMENTS 11,315,935 B2 4/2022 Park et al.
2017/0179152 A1* 6/2017 Toyama ................ H01L 23/528
(Continued)

FOREIGN PATENT DOCUMENTS

KR 10-2017-0061247 A 6/2017
KR 10-2021-0115716 A 9/2021
KR 10-2022-0043315 A 4/2022

OTHER PUBLICATIONS

Korean Office Action dated Feb. 27, 2026 issued in Korean Patent Application No. 10-2022-0108715 and English Translation thereof.

*Primary Examiner* — Davienne N Monbleau
*Assistant Examiner* — Emily Farmer
(74) *Attorney, Agent, or Firm* — Harness, Dickey & Pierce, P.L.C.

(57) ABSTRACT

A semiconductor device may include a peripheral circuit structure including cell region and an outside region, a cell structure on the cell region, an outside structure on the outside region, and an insulating layer. The outside structure may include a dummy stacked structure, a through electrode penetrating the dummy stacked structure and connected to the peripheral circuit structure, and a dummy vertical structure adjacent to the through electrode and penetrating at least a portion of the dummy stacked structure. The insulating layer may be between the dummy stacked structure and the peripheral circuit structure. The dummy stacked structure may include an upper dummy stacked structure on a lower dummy stacked structure. The upper dummy stacked structure may include upper dummy patterns stacked on the lower dummy stacked structure. The lower dummy stacked structure may include lower dummy patterns stacked on the outside region.

20 Claims, 23 Drawing Sheets

(56) References Cited

U.S. PATENT DOCUMENTS

| | | | | |
|---|---|---|---|---|
| 2021/0013304 | A1* | 1/2021 | Ryu | H10B 43/40 |
| 2021/0057444 | A1* | 2/2021 | Park | H10B 41/50 |
| 2021/0358935 | A1 | 11/2021 | Jung et al. | |
| 2021/0399005 | A1 | 12/2021 | Lee et al. | |
| 2022/0093621 | A1* | 3/2022 | Lee | H10B 63/34 |
| 2022/0122651 | A1 | 4/2022 | Kim et al. | |
| 2023/0014037 | A1 | 1/2023 | Jung et al. | |

* cited by examiner

SEMICONDUCTOR DEVICE INCLUDING DUMMY STACKED STRUCTURE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0108715, filed on Aug. 29, 2022 in the Korean Intellectual Property Office, the disclosure of which is incorporated by reference herein in its entirety.

BACKGROUND

Inventive concepts relate to a semiconductor device and an electronic system including the semiconductor device.

To meet excellent performance and a low price for consumers, increasing a degree of integration of semiconductor devices may be required. In the case of semiconductor devices, because the degree of integration may be an important factor in determining the price of a product, an increased degree of integration particularly may be required. In the case of two-dimensional or planar semiconductor devices, the degree of integration largely may be determined by the area occupied by unit memory cells and it thus may be affected by the level of fine pattern formation technology. However, because very costly equipment may be required to refine the pattern, the degree of integration of two-dimensional semiconductor devices increases but still may be limited. Accordingly, three-dimensional (3D) semiconductor memory devices having memory cells arranged three-dimensionally have been proposed.

SUMMARY

Inventive concepts provide a semiconductor device having improved reliability and inspection speed.

Inventive concepts provide an electronic system including a semiconductor device having improved reliability and inspection speed.

According to an embodiment of inventive concepts, a semiconductor device may include a peripheral circuit structure including a cell region and an outside region; a cell structure on the cell region of the peripheral circuit structure; an outside structure on the outside region of the peripheral circuit structure; and an insulating layer on the peripheral circuit structure. The cell structure may include an electrode structure including electrodes alternately arranged on the cell region, a channel structure penetrating the electrode structure, a conductive pattern connected to the channel structure, an upper horizontal electrode on the electrode structure and the conductive pattern, and an upper semiconductor pattern penetrating the upper horizontal electrode and connected to the conductive pattern. The outside structure may include a dummy stacked structure, a through electrode penetrating the dummy stacked structure and connected to the peripheral circuit structure, and a dummy vertical structure adjacent to the through electrode and penetrating at least a portion of the dummy stacked structure. The dummy stacked structure may include an upper dummy stacked structure on a lower dummy stacked structure. The upper dummy stacked structure may include upper dummy patterns stacked on the lower dummy stacked structure. The lower dummy stacked structure may include lower dummy patterns stacked on the outside region. The insulating layer may be between the dummy stacked structure and the peripheral circuit structure. At least a portion of the insulating layer may be between the dummy vertical structure and the peripheral circuit structure.

According to an embodiment of inventive concepts, a semiconductor device may include a peripheral circuit structure including a cell region and an outside region; a cell structure on the cell region of the peripheral circuit structure; an outside structure on the outside region of the peripheral circuit structure; and an insulating layer on the peripheral circuit structure. The cell structure may include a cell substrate, a lower electrode structure on the cell substrate, an upper electrode structure on the lower electrode structure, a channel structure penetrating the lower electrode structure and the upper electrode structure, an upper horizontal electrode on the channel structure, and an upper semiconductor pattern penetrating the upper horizontal electrode. The lower electrode structure may include a lower electrode and a lower mold insulating layer alternately stacked in the cell structure. The upper electrode structure may include an upper electrode and an upper mold insulating layer alternately stacked on the lower electrode structure. The upper semiconductor pattern may be connected to the channel structure. The outside structure may include a lower dummy stacked structure, an upper dummy stacked structure, a through electrode penetrating the upper dummy stacked structure and the lower dummy stacked structure, a plurality of dummy vertical structures surrounding the through electrode, and an insulating layer between the dummy stacked structure and the peripheral circuit structure. The lower dummy stacked structure may be level with the lower electrode structure. The lower dummy stacked structure may include a lower mold insulating layer and a lower dummy pattern alternately stacked. The upper dummy stacked structure may be level with the upper electrode structure. The upper dummy stacked structure may include an the upper mold insulating layer and an upper dummy pattern alternately stacked. The through electrode may be connected to the peripheral circuit structure. The plurality of dummy vertical structures may penetrate a portion of the upper dummy stacked structure, in a plan view. The insulating layer may be between the lower dummy stacked structure and the peripheral circuit structure. At least a portion of the insulating layer may be between the plurality of dummy vertical structures and the peripheral circuit structure.

According to an embodiment of inventive concepts, an electronic system may include a main substrate; a semiconductor device on the main substrate; and a controller electrically connected to the semiconductor device on the main substrate. The semiconductor device may include a peripheral circuit structure including a cell region and an outside region, a cell structure on the cell region of the peripheral circuit structure, an outside structure on the outside region of the peripheral circuit structure, and an insulating layer on the peripheral circuit structure. The cell structure may include an electrode structure including electrodes alternately arranged on the cell region, a channel structure penetrating the electrode structure, a conductive pattern connected to the channel structure, an upper horizontal electrode on the electrode structure and the conductive pattern, and an upper semiconductor pattern penetrating the upper horizontal electrode. The upper semiconductor pattern may be connected to the conductive pattern. The outside structure may include a dummy stacked structure, a through electrode penetrating the dummy stacked structure and connected to the peripheral circuit structure, and a plurality of dummy vertical structure adjacent to the through electrode and penetrating at least a portion of the dummy stacked structure. The dummy stacked structure may include an upper dummy stacked structure on a lower dummy stacked structure. The upper dummy stacked structure may include upper dummy patterns stacked on the lower dummy stacked structure. The lower dummy stacked structure may include lower dummy patterns stacked on the outside region. The insulating layer may be between the dummy stacked structure and the peripheral circuit structure. At least a portion of the insulating layer may be between the plurality of dummy vertical structures and the peripheral circuit structure.

BRIEF DESCRIPTION OF THE DRAWINGS

Embodiments will be more clearly understood from the following detailed description taken in conjunction with the accompanying drawings in which.

DETAILED DESCRIPTION

Figure 1:
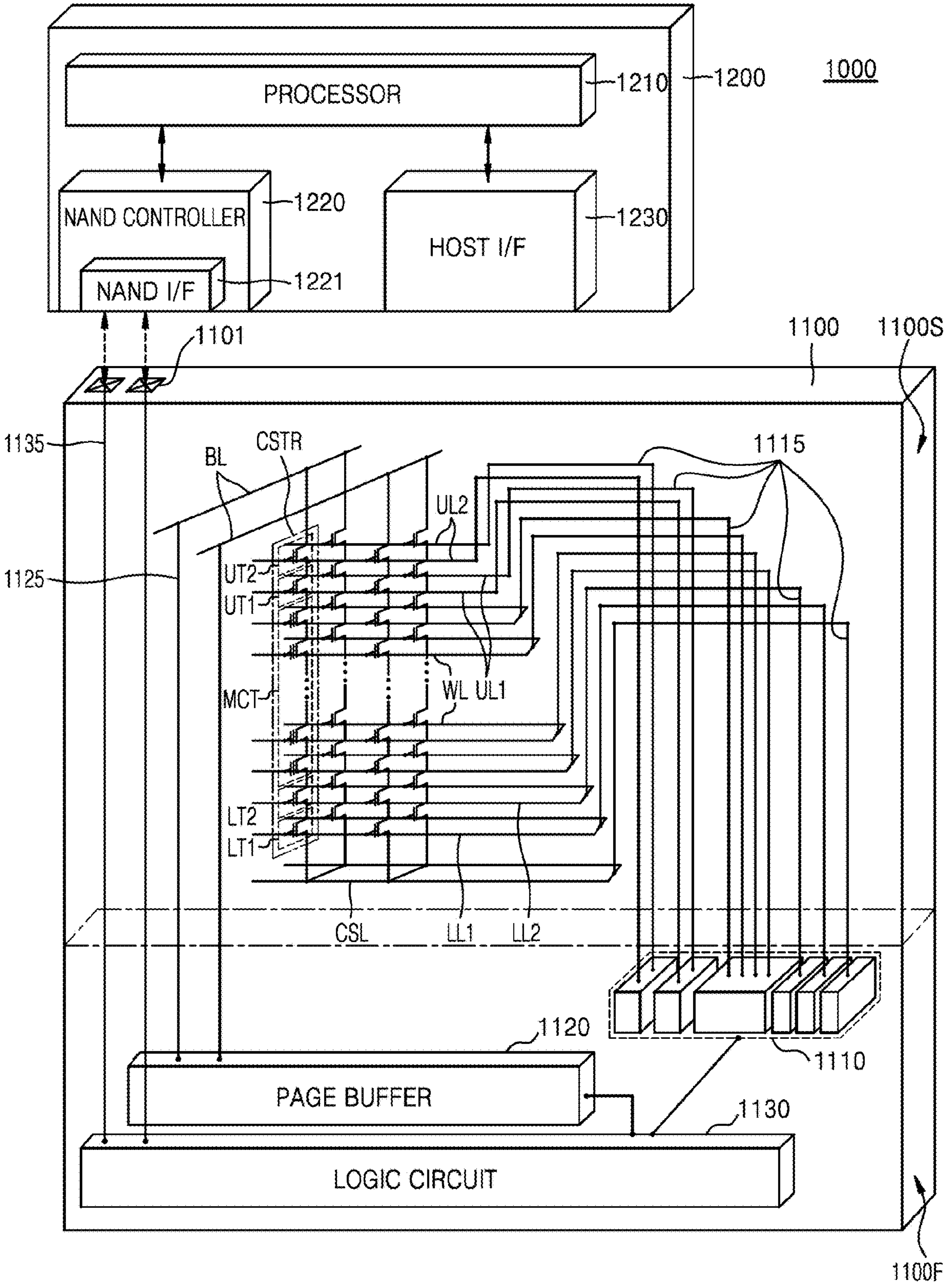
FIG. 1 is a schematic diagram of an electronic system including a semiconductor device, according to an embodiment.

Hereinafter, embodiments of inventive concepts are described in detail with reference to the accompanying drawings. Identical reference numerals are used for the same components in the drawings, and a duplicate description thereof will be omitted. In the following drawings, a thickness or size of each layer is exaggerated for convenience and clarity of description, and thus may differ from an actual shape or ratio.

FIG. 1 is a schematic diagram of an electronic system 1000 including a semiconductor device 1100, according to an embodiment.

Referring to FIG. 1, the electronic system 1000 according to the embodiment may include the semiconductor device 1100 and a controller 1200 electrically connected to the semiconductor device 1100. The electronic system 1000 may include a storage device including one or more semiconductor devices 1100, or an electronic device including a storage device. For example, the electronic system 1000 may include a solid state drive (SSD) device including one or a plurality of semiconductor devices 1100, a universal serial bus (USB) device, a computing system, a medical device, or a communication device.

The semiconductor device 1100 may include a non-volatile memory device, for example, a NAND flash memory device. The semiconductor device 1100 may include a first structure 1100F and a second structure 1100S on the first structure 1100F. As an example, the first structure 1100F may also be arranged next to the second structure 1100S. The first structure 1100F may include a peripheral circuit structure including a decoder circuit 1110, a page buffer 1120, and a logic circuit 1130. The second structure 1100S may include a memory cell structure including a bit line BL, a common source line CSL, word lines WL, a first gate upper line UL1 and a second gate upper line UL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to embodiments.

In example embodiments, the upper transistors UT1 and UT2 may include string select transistors, and the lower transistors LT1 and LT2 may include ground select transistors. The first and second gate lower lines LL1 and LL2 may respectively include gate electrodes of the lower transistors LT1 and LT2. The word lines WL may include gate electrodes of memory cell transistors MCT, and the first and second upper gate lines UL1 and UL2 may include gate electrodes of the upper transistors UT1 and UT2, respectively.

In some embodiments, the lower transistors LT1 and LT2 may respectively include a lower erase control transistor LT1 and a ground selection transistor LT2 connected to each other in series. Each of the upper transistors UT1 and UT2 may include a string selection transistor UT1 and an upper erase control transistor UT2 connected to each other in series. At least one of the lower transistors LT1 and LT2 and the upper transistor UT1 and UT2 may be used for an erase operation of erasing data stored in the memory cell transistors MCT by using a gate induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 via first connection wirings 1115 extending to the second structure 1100S in the first structure 1100F. The bit lines BL may be electrically connected to the page buffer 1120 via second connection wirings 1125 extending to the second structure 1100S in the first structure 1100F.

In the first structure 1100F, the decoder circuit 1110 and the page buffer 1120 may perform a control operation on at least one selection memory cell transistor among the plurality of memory cell transistors MCT. The decoder circuit 1110 and the page buffer 1120 may be controlled by the logic circuit 1130. The semiconductor device 1100 may communicate with the controller 1200 via an input/output pad 1101 electrically connected to the logic circuit 1130. The input/output pad 1101 may be electrically connected to the logic circuit 1130 via an input/output connection wiring 1135 extending to the second structure 1100S in the first structure 1100F.

The controller 1200 may include a processor 1210, a NAND controller 1220, and a host interface (I/F) 1230.

According to embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to certain firmware, and may access the semiconductor device 1100 by controlling the NAND controller 1220. The NAND controller 1220 may include a NAND I/F 1221, via which communication with the semiconductor device 1100 is performed. Via the NAND I/F 1221, a control command for controlling the semiconductor device 1100, data to be written to the plurality of memory cell transistors MCT of the semiconductor device 1100, data to be read from the plurality of memory cell transistors MCT of the semiconductor device 1100, or the like may be transmitted. The host I/F 1230 may provide a communication function between the electronic system 1000 and an external host. When a control command is received from the external host via the host I/F 1230, the processor 1210 may control the semiconductor device 1100 in response to the control command.

Figure 2:
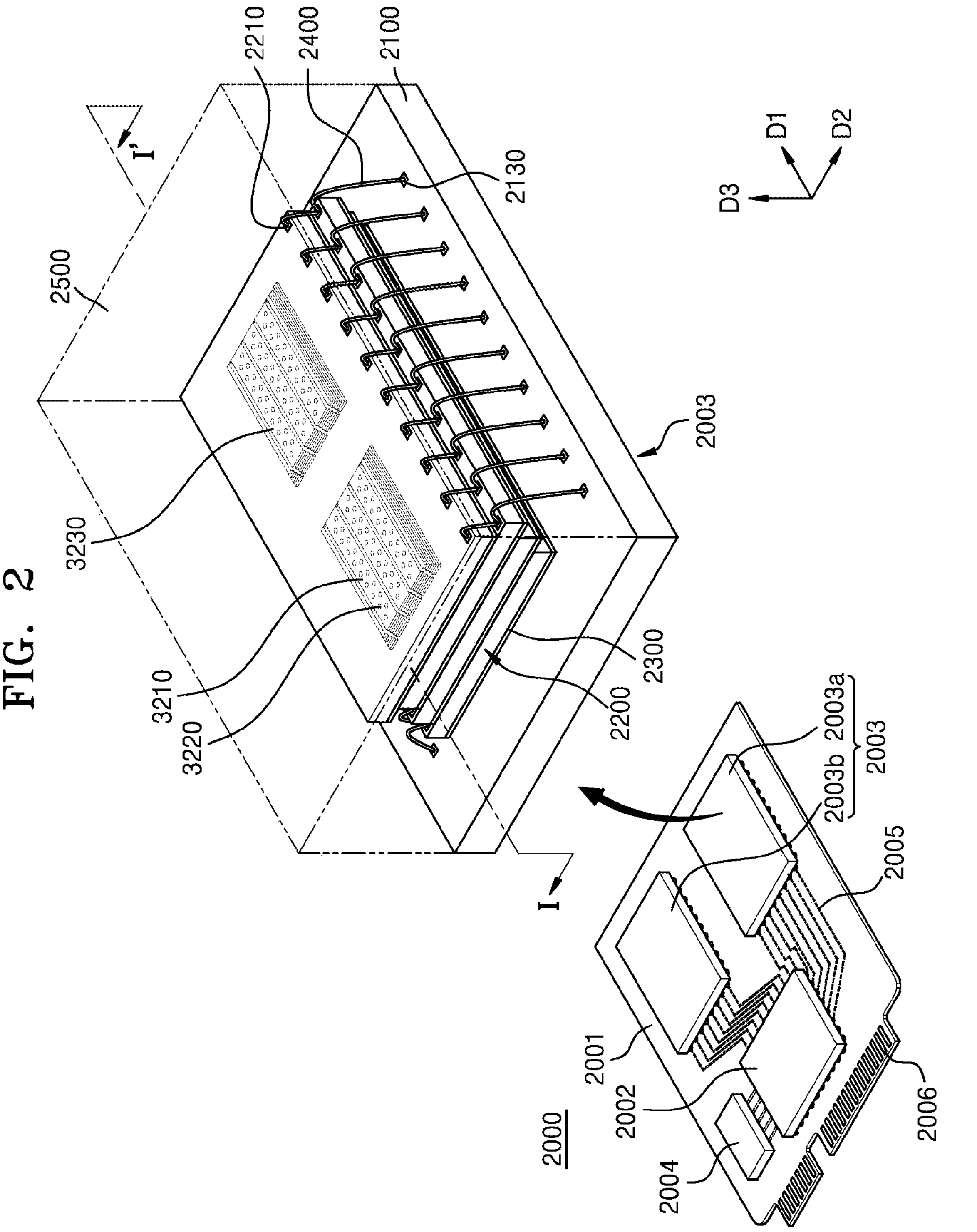
FIG. 2 is a schematic perspective view of an electronic system including a semiconductor device, according to an embodiment.

FIG. 2 is a schematic perspective view of an electronic system 2000 including the semiconductor device according to an embodiment.

Referring to FIG. 2, the electronic system 2000 according to an embodiment may include a main substrate 2001, a controller 2002 mounted on the main substrate 2001, one or more semiconductor packages 2003, and dynamic random-access memory (DRAM) 2004. The semiconductor package 2003 and the DRAM 2004 may be connected to the controller 2002 via wiring patterns 2005 formed on the main substrate 2001.

The main substrate 2001 may include a connector 2006 including a plurality of pins coupled with the external host. The number and arrangement of the plurality of pins in the connector 2006 may vary depending on a communication interface between the electronic system 2000 and the external host. In some embodiments, the electronic system 2000 may communicate with the external host according to any one of interfaces, such as USB, peripheral component interconnect (PCI) express (PCI-E), serial advanced technology attachment (SATA), and M-Phy for a universal flash storage (UFS). In some embodiments, the electronic system 2000 may operate by power supplied by the external host via the connector 2006. The electronic system 2000 may further include a power management integrated circuit (PMIC), which distributes power supplied by the external host to the controller 2002 and the semiconductor package 2003.

The controller 2002 may write data to the semiconductor package 2003, or read data from the semiconductor package 2003, and may improve an operation speed of the electronic system 2000.

The DRAM 2004 may include a buffer memory for reducing a speed difference between the semiconductor package 2003, which is a data storage space, and the external host. The DRAM 2004 included in the electronic system 2000 may also operate as a kind of cache memory, and may also provide a space for temporarily storing data in a control operation on the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include a first semiconductor package 2003*a* and a second semiconductor package 2003*b*, which are apart from each other. Each of the first and second semiconductor packages 2003*a* and 2003*b* may include a semiconductor package including semiconductor chips 2200. Each of the first and second semiconductor packages 2003*a* and 2003*b* may include the package substrate 2100, the semiconductor chips 2200 on the package substrate 2100, an adhesive layer 2300 arranged under a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may include a printed circuit board including package upper pad units 2130. Each of the semiconductor chips 2200 may include an input/output pad unit 2210. The input/output pad unit 2210 may correspond to the I/O pad 1101 in FIG. 1. Each of the semiconductor chips 2200 may include gate stack structures 3210 and vertical structures 3220. Each of the semiconductor chips 2200 may include a semiconductor device according to embodiments described below.

In some embodiments, the connection structure 2400 may include a bonding wire electrically connecting the I/O pad unit 2210 to the package upper pad units 2130. In each of the first and second semiconductor packages 2003*a* and 2003*b*, the semiconductor chips 2200 may be electrically connected to each other by using a bonding wire method, and may be electrically connected to the package upper pad units 2130 of the package substrate 2100. According to embodiments, in the first and second semiconductor packages 2003*a* and 2003*b*, the semiconductor chips 2200 may be electrically connected to each other via a connection structure including through silicon vias TSV, instead of the connection structure 2400 of the bonding wire type.

According to some embodiments, the controller 2002 and the semiconductor chips 2200 may also be included in one package. In some embodiment, the controller 2002 and the semiconductor chips 2200 may be mounted on a separate interposer substrate that is different from the main substrate 2001, and the controller 2002 and the semiconductor chips 2200 may be connected to each other by wirings formed on the interposer substrate.

Figure 3:
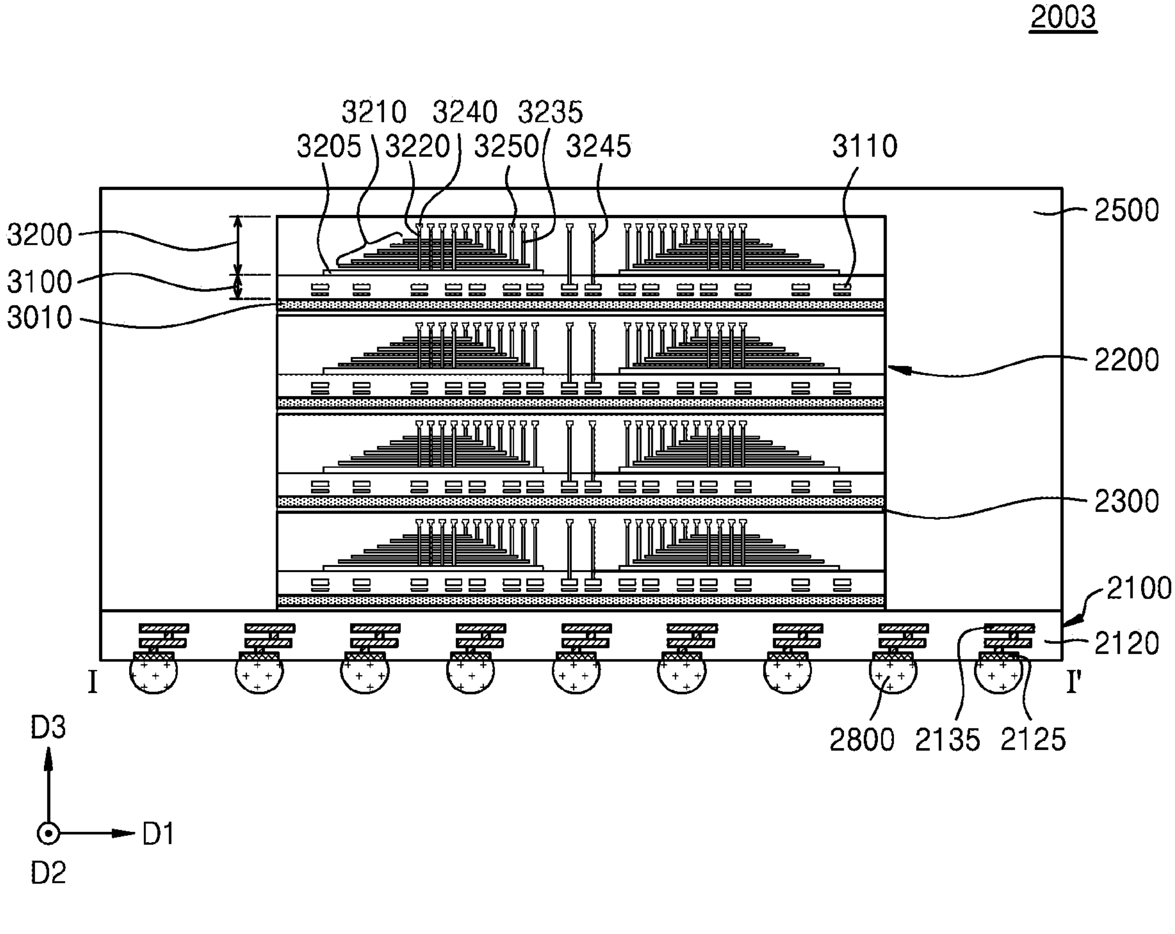
FIGS. 3 and 4 are schematic cross-sectional views of semiconductor packages, according to embodiments.
Figure 4:
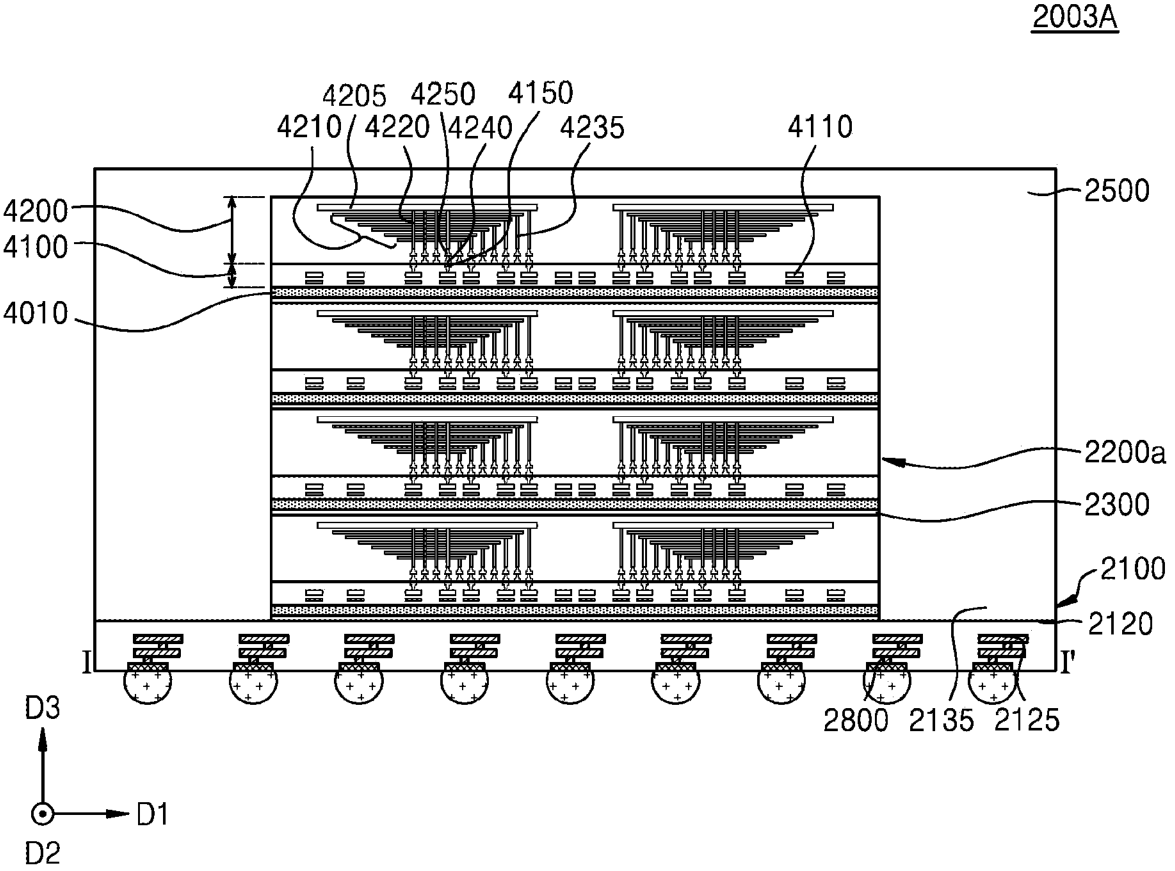

FIGS. 3 and 4 are schematic cross-sectional views of semiconductor packages, according to embodiments. FIGS. 3 and 4 are embodiments of the semiconductor package in FIG. 2 and a semiconductor package, respectively, and FIGS. 3 and 4 are conceptual cross-sectional view taken along line I-I' of the semiconductor package 2003 in FIG. 2.

Referring to FIG. 3, in the semiconductor package 2003, the package substrate 2100 may include a printed circuit board. The package substrate 2100 may include a package substrate body unit 2120, the package upper pad units (2130 in FIG. 2) arranged on an upper surface of the package substrate body unit 2120, lower pad units 2125 arranged under a lower surface of the package substrate body unit 2120 or exposed through the lower surface thereof, and internal wirings 2135 electrically connecting the package upper pad units 2130 to the lower pad units 2125 in the package substrate body unit 2120. The lower pad units 2125 may be connected to the wiring patterns 2005 of the main substrate 2001 of the electronic system 2000, as illustrated in FIG. 2, via conductive connection units 2800.

Each of the semiconductor chips 2200 may include a semiconductor substrate 3010, and a first structure 3100 and a second structure 3200, which are sequentially stacked on the semiconductor substrate 3010. The first structure 3100 may include a peripheral circuit region including periphery wirings 3110. The second structure 3200 may include a source structure 3205, a stacked structure 3210 on the source structure 3205, vertical structures 3220 penetrating the stacked structure 3210, bit lines 3240 electrically connected to the vertical structures 3220, and cell contact plugs 3235 electrically connected to the word lines (WL in FIG. 1) of the stacked structure 3210. The second structure 3200 may further include separation structures refer to 3230 in FIG. 2) to be described below.

Each of the semiconductor chips 2200 may include a through wiring 3245, which is electrically connected to the periphery wirings 3110 of the first structure 3100 and extends into the second structure 3200. The through wiring 3245 may be arranged outside the stacked structure 3210 or may be arranged to penetrate the stacked structure 3210. Each of the semiconductor chips 2200 may further include the I/O pad unit (2210 in FIG. 2) electrically connected to the periphery wirings 3110 of the first structure 3100.

Referring to FIG. 4, in the semiconductor package 2003A, each of semiconductor chips 2200*a* may include a semiconductor substrate 4010, a first structure 4100 on the semiconductor substrate 4010, and a second structure 4200 bonded to the first structure 4100 by using a wafer bonding method on the first structure 4100.

The first structure 4100 may include a peripheral circuit region including a periphery wiring 4110 and first bonding structures 4150. The second structure 4200 may include a source structure 4205, a stacked structure 4210 between the source structure 4205 and the first structure 4100, vertical structures 4220 penetrating the stacked structure 4210, and second bonding structures 4240 respectively and electrically connected to the word lines (WL in FIG. 1) of the stacked structure 4210, respectively. For example, the second bonding structures 4240 may be respectively and electrically connected to the vertical structures 4220 and the word lines (WL in FIG. 1) via bit lines 4250 electrically connected to the vertical structures 4220 and the cell contact plugs 4235 electrically connected to the word lines (WL in FIG. 1). The first bonding structures 4150 of the first structure 4100 and the second bonding structures 4240 of the second structure 4200 may be bonded while being in contact with each other. Bonded portions of the first bonding structures 4150 and the second bonding structures 4240 may include, for example, copper (Cu). Each of the semiconductor chips 2200*a* may further include the I/O pad unit (2210 in FIG. 2) electrically connected to periphery wirings 4110 of the first structure 4100.

The semiconductor chips 2200 in FIG. 3 and the semiconductor chips 2200*a* in FIG. 4 may be electrically connected to each other by using the bonding wire-shaped connection structures (2400 in FIG. 2). In some embodiments, the semiconductor chips in one semiconductor package, such as the semiconductor chips 2200 in FIG. 3 and the semiconductor chips 2200*a* in FIG. 4, may be electrically connected to each other by using a connection structure including a through electrode TSV.

The first structure 3100 in FIG. 3 and the first structure 4100 in FIG. 4 may correspond to the peripheral circuit structure in the embodiments described below, and the second structure 3200 in FIG. 3 and the second structure 4200 in FIG. 4 may correspond to a cell structure in the embodiments described below.

Figure 5:
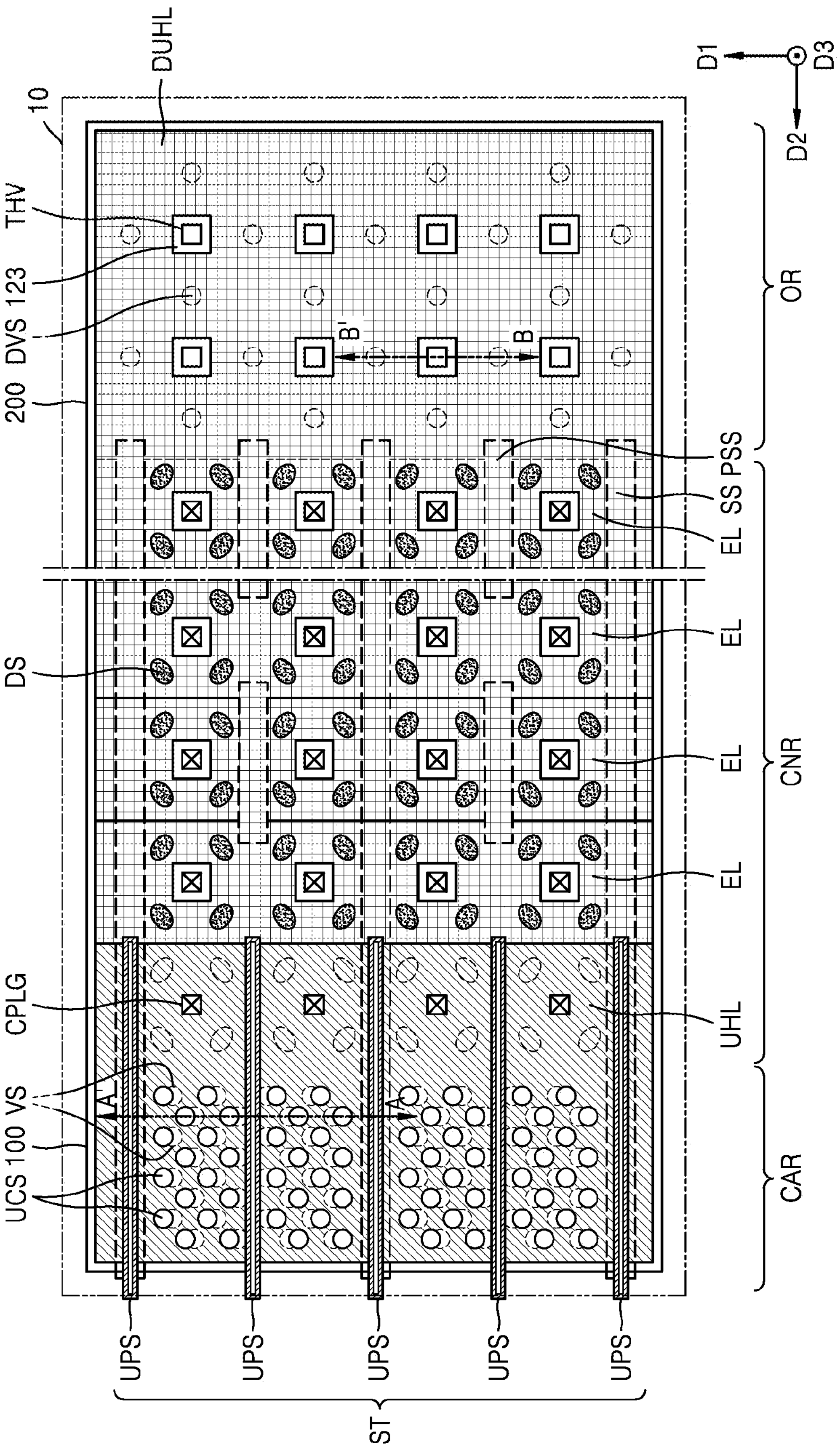
FIG. 5 is a plan view of a semiconductor device, according to an embodiment.

FIG. 5 is a plan view of a semiconductor device, according to an embodiment. FIGS. 6A through 6D are enlarged plan views of an external region of a semiconductor device, according to embodiments. FIG. 7A is a cross-sectional view of a cell region and an external region of a semiconductor device taken along lines A-A' and B-B' in FIG. 5, according to embodiments. FIGS. 7B and 7C are enlarged cross-sectional views of a region EX1 and a region EX2 in FIG. 7A, respectively.

Referring to FIGS. 5 and 7A, a peripheral circuit structure PS including a peripheral circuit board 10 and peripheral circuit transistors PTR may be provided. The peripheral circuit board 10 may include a cell region CAR, a connection region CNR, and an outside region OR. The peripheral circuit structure PS may include the cell region CAR, the connection region CNR, and the outside region OR. A cell structure CS may be arranged in the cell region CAR of the peripheral circuit structure PS. A cell structure CS including an electrode structure ST and a channel structure VS may be arranged on the peripheral circuit structure PS. The outside structure OS may be arranged on the outside region OR of the peripheral circuit structure PS. The outside structure OS including a dummy stacked structure DST and a dummy vertical structure DVS may be arranged on the peripheral circuit structure PS.

The peripheral circuit board 10 may include a silicon substrate, a silicon-germanium substrate, a germanium substrate, or a single crystal epitaxial layer grown on a single crystal silicon substrate. The peripheral circuit board 10 may include active regions defined by a peripheral circuit element isolation layer 13. The peripheral circuit transistors PTR may be portions of a decoder circuit, a page buffer, a logic circuit, or the like described with reference to FIG. 1.

The peripheral circuit structure PS may include peripheral circuit wirings 33 respectively provided on the peripheral circuit transistors PTR, and a peripheral circuit insulating layer 50 covering the peripheral circuit transistors PTR and the peripheral circuit wirings 33. A peripheral circuit contact 31 may be provided between the peripheral circuit wirings 33 and the peripheral circuit transistors PTR. The peripheral circuit contact 31 may electrically connect the peripheral circuit transistors PTR to the peripheral circuit wirings 33. The peripheral circuit insulating layer 50 may include insulating layers stacked in multiple layers. The peripheral circuit insulating layer 50 may include, for example, a silicon oxide layer, a silicon nitride layer, a silicon oxynitride layer, and/or a low dielectric layer.

The cell structure CS may be arranged on the peripheral circuit insulating layer 50. The cell structure CS may include a cell substrate 100, a source structure SC, an electrode structure ST, and channel structures VS. The cell structure CS may include cell strings CSTR described with reference to FIG. 1. The cell strings CSTR may include the electrode structure ST and the channel structures VS.

In the cell region CAR, the cell substrate 100 may be arranged on an upper surface of the peripheral circuit insulating layer 50. The cell substrate 100 may include, for example, at least one of silicon (Si), germanium (Ge), silicon germanium (SiGe), gallium arsenide (GaAs), indium gallium arsenide (InGaAs), aluminum gallium arsenide (AlGaAs), and a mixture thereof. The cell substrate 100 may include a semiconductor doped with dopants having a first conductivity type and/or an intrinsic semiconductor not doped with impurities. The first conductive type may be, for example, n-type. The cell substrate 100 may have a crystal structure including at least one of a single crystal structure, an amorphous structure, and a polycrystalline structure. The cell substrate 100 may have an upper surface extending in a first horizontal direction D1 and a second horizontal direction D2 perpendicular to the first horizontal direction D1. The cell substrate 100 may be in contact with the peripheral circuit insulating layer 50.

The source structure SC may be arranged between the electrode structure ST and the cell substrate 100. The source structure SC may be in parallel with the upper surface of the cell substrate 100, and may extend in parallel with the electrode structure ST in the first horizontal direction D1 and the second horizontal direction D2. The source structure SC may include a first horizontal pattern SCP1 and a second horizontal pattern SCP2 on the first horizontal pattern SCP1. The first horizontal pattern SCP1 and the second horizontal pattern SCP2 may be sequentially stacked on the cell substrate 100. Each of the first and second horizontal patterns SCP1 and SCP2 may include a semiconductor material doped with dopants of the first conductivity type. In other words, the first and second horizontal patterns SCP1 and SCP2 may include a semiconductor material doped with n-type dopants. The dopants may include, for example, phosphor (P) or arsenic (As). According to some embodiments, the first horizontal pattern SCP1 may have an n-type dopant concentration that is greater than that of the second horizontal pattern SCP2.

The electrode structure ST may be arranged on the cell substrate 100. The electrode structure ST may be between the separation structures SS extending side by side in the second horizontal direction D2. The electrode structure ST may be apart from the cell substrate 100 with the source structure SC therebetween. The electrode structure ST may extend from the cell region CAR to the connection region CNR in the second horizontal direction D2.

The electrode structure ST may include a lower electrode structure ST1, in which a lower electrode EL1 and a lower mold insulating layer ILD1 are alternately stacked in a direction D3 perpendicular to the upper surface of the cell substrate 100, and an upper electrode structure ST2, in which an upper electrode EL2 and an upper mold insulating layer ILD2 are alternately stacked on the lower electrode structure ST1. Lower electrodes EL1, upper electrodes EL2, lower mold insulating layers ILD1, and upper mold insulating layers ILD2 may be between a pair of separation structures SS adjacent to each other in the first horizontal direction D1. One or two lower electrodes EL1 at the lowermost vertical level among the lower electrodes EL1 of the lower electrode structure ST1 may be a lower selection line. The remaining lower and upper electrodes EL1 and EL2 except for the lower selection line may be word lines (WL in FIG. 1). Thicknesses of the lower and upper electrodes EL1 and EL2 may be substantially the same as each other, and thicknesses of the lower and upper mold insulating layers ILD1 and ILD2 may vary depending on characteristics of a semiconductor device. For example, the lower mold insulating layer ILD1 between the lower selection line and the word line WL may be thicker than the lower and upper mold insulating layers ILD1 and ILD2 between the word lines WL. The lower and upper mold insulating layers ILD1 and ILD2 on upper surfaces of the uppermost lower and upper electrodes EL1 and EL2 of the lower and upper electrode structures ST1 and ST2 among the lower and upper mold insulating layers ILD1 and ILD2 may be thicker than other lower and upper mold insulating layers ILD1 and ILD2, respectively. Each of the lower and upper electrodes EL1 and EL2 may include at least one of doped semiconductor (for example, doped silicon), metal (for example, tungsten, copper, or aluminum), conductive metal nitride (for example, nitride titanium or nitride tantalum), and transition metal (for example, titanium or tantalum). Each of the lower and upper mold insulating layers ILD1 and ILD2 may include a silicon oxide layer.

The electrode structure ST may have a stepped structure in the connection region CNR. The stepped structure of the electrode structure ST may have a height that decreases away from the cell region CAR. The stepped structure of the electrode structure ST may define pad units in the connection region CNR. The pad units may include portions of the lower and upper electrodes EL1 and EL2. Portions of the lower and upper electrodes EL1 and EL2 defining the pad units may not be covered by the lower and upper electrodes EL1 and EL2, which are arranged directly thereabove. The pad units may have a structure for connecting each of the lower and upper electrodes EL1 and EL2 to the peripheral circuit structure PS. Each of the pad units may be connected to cell contact plugs CPLG.

In the cell region CAR, a plurality of channel structures VS penetrating the electrode structure ST may be provided. The channel structures VS may be arranged in the first horizontal direction D1 and the second horizontal direction D2. Any one of the channel structures VS may vertically overlap the upper separation pattern UPS.

The channel structure VS may be provided in lower and upper channel holes CH1 and CH2 penetrating the electrode structure ST. The channel structure VS may be provided in the lower channel hole CH1 penetrating the lower electrode structure ST1 and the upper channel hole CH2 penetrating the upper electrode structure ST2. An upper surface of the channel structure VS may be at the same vertical level as an upper surface of the uppermost upper mold insulating layer ILD2 of the lower and upper mold insulating layers ILD1 and ILD2 of the electrode structure ST. A lower surface of the channel structure VS may be at a lower vertical level than the upper surface of the cell substrate 100.

The channel structure VS may penetrate the source structure SC. In other words, the lower surface of the channel structure VS may be at a lower vertical level than a lower surface of the source structure SC. A lower structure of the channel structure VS is not limited to that illustrated in the drawing. For example, in some embodiments, unlike illustrated in the drawings, the source structure SC may penetrate a channel insulating pattern VP and contact a channel semiconductor pattern SP. In some embodiments, a portion of the source structure SC penetrating the channel insulating pattern VP may extend from a side surface of the channel semiconductor pattern SP and may thus have a T-shape cross-section.

The diameter of the channel structure VS may include a portion in which the width thereof gradually decreases toward the peripheral circuit board 10. For example, the channel structure VS may include a portion in which the diameter thereof in the horizontal direction gradually decreases in the upper channel hole CH2 penetrating the upper electrode structure ST2. For example, the channel structure VS may include a portion in which the diameter thereof in the horizontal direction gradually decreases in the lower channel hole CH1 penetrating the lower electrode structure ST1.

The channel structure VS may include a portion in which the diameter thereof in the horizontal direction discontinuously changes. The diameter of the channel structure VS in the horizontal direction may discontinuously change at the boundary of the upper channel hole CH2 and the lower channel hole CH1. For example, the diameter in the horizontal direction in the channel structure VS may gradually decrease in the upper channel hole CH2, then discontinuously increase at the boundary with the lower channel hole CH1, and then gradually decrease in the lower channel hole CH1 again. In some embodiments, the sidewall of the channel structure VS may have a step at a boundary of the lower electrode structure ST1 and the upper electrode structure ST2. In other words, the channel structure VS may have a bent unit at a boundary of the lower electrode structure ST1 and the upper electrode structure ST2.

Each of the channel structures VS may include the channel insulating pattern VP, the channel semiconductor pattern SP, a buried insulating pattern VI, and a conductive pad PD. The channel insulating pattern VP, the channel semiconductor pattern SP, and the buried insulating pattern VI may be sequentially provided on inner surfaces of lower and upper channel holes CH1 and CH2. The conductive pad PD may be provided on the buried insulating pattern VI and the channel semiconductor pattern SP.

The channel semiconductor pattern SP may be arranged between the channel insulating pattern VP and the buried insulating pattern VI. The channel semiconductor pattern SP may be apart from the lower and upper electrodes EL1 and EL2 with the channel insulating pattern VP therebetween. The channel semiconductor pattern SP may include a semiconductor material, such as Si and Ge, or a mixture thereof. In addition, the channel semiconductor pattern SP may also include an impurity-doped semiconductor or an intrinsic semiconductor not doped with impurities. The channel semiconductor pattern SP may function as a channel of transistors constituting a NAND cell string.

The buried insulating pattern VI may cover an inner surface of the channel semiconductor pattern SP. The buried insulating pattern VI may be apart from the channel insulating pattern VP with the channel semiconductor pattern SP arranged therebetween. The buried insulating pattern VI may have a cylindrical shape.

The channel insulating pattern VP may surround the channel semiconductor pattern SP. The channel insulating pattern VP may cover an outer surface of the channel semiconductor pattern SP. The channel insulating pattern VP may include one thin layer or a plurality of thin layers.

Referring to FIG. 7B, the channel insulating pattern VP may include a data storage layer. According to some embodiments, the channel insulating pattern VP may include, as a data storage layer of a NAND flash memory device, a tunnel insulating layer TL2, a charge storage layer CL2, and a blocking insulating layer BIL2.

The charge storage layer CL2 may include an insulating layer including a trap insulating layer, a floating gate electrode, or conductive nanodots. The charge storage layer CL2 may include at least one of a silicon nitride layer, a silicon oxynitride layer, a silicon-rich nitride layer, a nano-crystalline Si layer, and a laminated trap layer. The tunnel insulating layer TL2 may include a material having a band gap greater than that of the charge storage layer. The tunnel insulating layer TL2 may include a high dielectric layer, such as an aluminum oxide layer and a hafnium oxide layer, or a silicon oxide layer. The blocking insulating layer BIL2 may include a silicon oxide layer and/or an aluminum oxide layer.

The conductive pad PD may cover an upper surface of the channel semiconductor pattern SP and an upper surface of the buried insulating pattern VI. The conductive pad PD may include an impurity-doped semiconductor material and/or a metal material.

An electrode barrier layer HF may be provided between the lower and upper electrodes EL1 and EL2 and the lower and upper mold insulating layers ILD1 and ILD2. The electrode barrier layer HF may extend between the lower and upper electrodes EL1 and EL2 and the channel structures VS. The electrode barrier layer HF may include a metal nitride, such as titanium nitride, tantalum nitride, and tungsten nitride. The electrode barrier layer HF may further include a transition metal layer, such as titanium and tantalum, in addition to the metal nitride. On the other hand, the electrode barrier layer HF may include a metal oxide layer having a high dielectric constant, such as an aluminum oxide layer and a hafnium oxide layer.

Referring to FIGS. 5 and 7A again, dummy structures DS may be provided in the connection region CNR. The dummy structures DS may penetrate the stepped structure of the electrode structure ST. The dummy structures DS may be formed together with the channel structures VS, and may have a structure similar to that of the channel structures VS. Unlike the channel structures VS, the dummy structures DS may not function as a channel of a memory cell. The dummy structures DS may not be electrically connected to the bit lines BLs to be described below. In other words, the dummy structures DS may not function as a circuit. The dummy structures DS may serve as pillars (that is, supports) physically supporting the stepped structure of the electrode structure ST. In a plan view, the size (for example, maximum diameter) of each of the dummy structures DS may be greater than the size (for example, maximum diameter) of each of the channel structures VS.

The separation structures SS may cross electrode structures ST. The separation structures SS may be apart from each other in the first horizontal direction D1, and may extend in parallel with each other in the second horizontal direction D2. The separation structures SS may extend from the cell region CAR to the connection region CNR, and may completely cross the electrode structure ST. A pair of separation structures SS adjacent to each other in the first horizontal direction D1 may separate the electrodes EL in one electrode structure ST from the other electrodes EL in the other adjacent electrode structures ST. In addition, a pair of separation structures SS may separate the source structures SC in one electrode structure ST from the other source structures SC in the adjacent electrode structures ST. Each of the separation structures SS may have a line shape or a bar shape. The separation structures SS may include an insulating material. The separation structures SS may include, for example, silicon oxide.

Upper surfaces of the separation structures SS may be at the same vertical level as an upper surface of the uppermost upper mold insulating layer ILD2 among the lower and upper mold insulating layers ILD1 and ILD2 of the electrode structure ST. The upper surfaces of the separation structures SS may be coplanar with the upper surface of the uppermost upper mold insulating layer ILD2 among the lower and upper mold insulating layers ILD1 and ILD2 of the electrode structure ST. Lower surfaces of the separation structures SS may be at a lower vertical level than the upper surface of the cell substrate 100.

Partial separation structures PSS may be provided between the separation structures SS. The partial separation structures PSS may extend in the second horizontal direction D2 in the connection region CNR. Unlike the separation structures SS, the partial separation structures PSS may not completely cross the electrode structure ST. Each of the partial separation structures PSS may have a shorter line shape or a shorter bar shape than the separation structures SS. The partial separation structures PSS may be formed together with the separation structures SS, and may include the same material as the separation structures SS.

Referring to FIGS. 7A and 7B, a first insulating layer 121 may be arranged on the electrode structure ST. The first insulating layer 121 may be on an upper surface of the uppermost upper mold insulating layer ILD2 among the lower and upper mold insulating layers ILD1 and ILD2 of the electrode structure ST. The first insulating layer 121 may cover the channel structures VS and the separation structures SS. The first insulating layer 121 may include the lower and upper mold insulating layers ILD1 and ILD2 and a material having etching selectivity. The first insulating layer 121 may include, for example, silicon nitride. The thickness of the first insulating layer 121 may be less than a thickness of the uppermost upper mold insulating layer ILD2 among the lower and upper mold insulating layers ILD1 and ILD2.

Capping patterns IP may be provided between the first insulating layer 121 and pads PD of the channel structures VS. An upper surface of the capping patterns IP may be at the same vertical level as an upper surface of the uppermost upper mold insulating layer ILD2 among the lower and upper mold insulating layers ILD1 and ILD2 of the electrode structure ST. In addition, the upper surface of the capping pattern IP may be at the same vertical level as an upper surface of the channel insulating pattern VP. One side surface of the capping pattern IP may face an inner side surface of the channel insulating pattern VP. Another side surface of the capping pattern IP may face a first side surface s1 of the conductive pattern CP to be described below. The capping pattern IP may have a thickness that is less than that of the first insulating layer 121. The capping pattern IP may include the first insulating layer 121 and a material having etching selectivity. The capping pattern IP may include, for example, silicon oxide.

A second insulating layer 122 may be arranged on an upper surface of the first insulating layer 121. The second insulating layer 122 may have a thickness that is greater than that of the first insulating layer 121. The thickness of the second insulating layer 122 may be less than the thickness of the uppermost upper mold insulating layer ILD2 among the lower and upper mold insulating layers ILD1 and ILD2. The second insulating layer 122 may include the first insulating layer 121 and a material having etching selectivity. The second insulating layer 122 may include, for example, silicon nitride. The second insulating layer 122 may not be in contact with the conductive pads PD of the channel structures VS. The second insulating layer 122 may be apart from the channel structures VS with the first insulating layer 121 therebetween.

Conductive patterns CP may be provided between the second insulating layer 122 and the channel structures VS and between the second insulating layer 122 and the upper mold insulating layer ILD2. The conductive pattern CP may partially overlap the channel structure VS. In other words, the conductive pattern CP may not completely overlap the channel structure VS. The center of the conductive pattern CP in the horizontal direction may be apart from the center of the channel structure VS in the horizontal direction. The conductive pattern CP may penetrate the first insulating layer 121, and may be connected to the channel structure VS. A lower portion of the conductive pattern CP may penetrate the capping pattern IP, and may be connected to the conductive pad PD of the channel structure VS. The capping pattern IP may cover a portion of the upper surface of the conductive pad PD. The conductive pattern CP may cover the other portion of the upper surface of the conductive pad PD. The conductive pattern CP may have first and second side surfaces s1 and s2 facing the first insulating layer 121. The upper surface of the conductive pattern CP may be partially covered by the second insulating layer 122. The conductive pattern CP may include a semiconductor material, such as Si and Ge, or a mixture thereof. The conductive pattern CP may include, for example, a semiconductor material doped with impurities.

Referring to FIGS. 5 and 7A again, an upper horizontal electrode UHL may be provided on the second insulating layer 122. The upper horizontal electrode UHL may partially overlap the electrode structures ST. The upper horizontal electrode UHL may be on the cell region CAR. According to some embodiments, the upper horizontal electrode UHL may extend to the connection region CNR, and may be on some of the dummy structures DS. The upper horizontal electrode UHL may not completely cover the connection region CNR. In other words, some of the other dummy structures DS, some of electrodes EL, and some of the separation structures SS may not overlap the upper horizontal electrode UHL. The upper horizontal electrodes UHL may be separated into a plurality of upper horizontal electrodes UHL by an upper separation pattern UPS. The plurality of upper horizontal electrodes UHL may be apart from each other in the first horizontal direction D1 with the upper separation pattern UPS therebetween. Each of the plurality of upper horizontal electrodes UHL may include a string selection line. For example, each of the plurality of upper horizontal electrodes UHL may include at least one gate electrode among the upper transistors UT1 and UT2 described with reference to FIG. 1.

The upper horizontal electrodes UHL may be vertically spaced apart from the channel structures VS with the first insulating layer 121 and the second insulating layer 122 therebetween. In other words, a lower surface of the upper horizontal electrode UHL may be at a higher vertical level than upper surfaces of the channel structures VS. The upper horizontal electrode UHL may have a thickness that is greater than that of each of the first insulating layer 121 and the second insulating layer 122. The upper horizontal electrode UHL may include a conductive material. The upper horizontal electrode UHL may include at least one of doped semiconductor (for example, doped silicon), metal (for example, tungsten, copper, or aluminum), conductive metal nitride (for example, nitride titanium or nitride tantalum), and transition metal (for example, titanium or tantalum).

A first interlayer insulating layer 131 and a second interlayer insulating layer 141 may be sequentially stacked on the upper horizontal electrode UHL. The first interlayer insulating layer 131 and the second interlayer insulating layer 141 may include, for example, one of silicon oxide, silicon nitride, and silicon oxynitride. According to some embodiments, the first interlayer insulating layer 131 and the second interlayer insulating layer 141 may be connected to each other, and may form one body. In other words, an interface between the first interlayer insulating layer 131 and the second interlayer insulating layer 141 may not be differentiated.

An upper channel structure UCS may penetrate the upper horizontal electrode UHL and the first interlayer insulating layer 131, and may be connected to the conductive pattern CP. The upper channel structure UCS may be provided in an upper hole H penetrating the upper horizontal electrode UHL and the first interlayer insulating layer 131. Inner side surfaces of the upper hole H may be defined by the second insulating layer 122, the upper horizontal electrode UHL, and the first interlayer insulating layer 131. A bottom of the upper hole H may be defined by the second insulating layer 122. In other words, the bottom of the upper hole H may be at a lower vertical level than the lower surface of the upper horizontal electrode UHL. The upper channel structure UCS may extend under the bottom of the upper hole H, and may contact the upper surface of the conductive pattern CP. The upper surface of the upper channel structure UCS may be covered by the second interlayer insulating layer 141.

The upper channel structure UCS may include an upper insulating pattern UVP, an upper semiconductor pattern USP, an upper buried insulating pattern UVI, and an upper conductive pad UPD. The upper insulating pattern UVP, the upper semiconductor pattern USP, and the upper buried insulating pattern UVI may be provided in order from the inner side surface of the upper hole H. The conductive pad PD may be provided on the upper buried insulating pattern UVI and the upper semiconductor pattern USP.

The upper semiconductor pattern USP may be arranged between the upper insulating pattern UVP and the upper buried insulating pattern UVI. The upper semiconductor pattern USP may be apart from the upper horizontal electrode UHL with the upper insulating pattern UVP therebetween. The upper semiconductor pattern USP may include a semiconductor material, such as Si and Ge, or a mixture thereof. In addition, the upper semiconductor pattern USP may also include an impurity-doped semiconductor or an intrinsic semiconductor not in an impurity-doped state. The upper semiconductor pattern USP may extend under the bottom of the upper hole H, and may contact the upper surface of the conductive pattern CP. A lower hole LH having a width that is less than that of the upper hole H may be formed between the bottom of the upper hole H and the conductive pattern CP. The lower hole LH may have an inner side surface defined by the second insulating layer 122. The upper semiconductor pattern USP may extend from the inside of the upper hole H to the inside of the lower hole LH. The upper semiconductor pattern USP may cover the inner side surface of the lower hole LH. In other words, the upper semiconductor pattern USP may be in contact with the second insulating layer 122. According to some embodiments, the upper semiconductor pattern USP may be connected to the conductive pattern CP, and may form one body. The upper semiconductor pattern USP may be formed together with the conductive pattern CP, and there may not be an interface between the upper semiconductor pattern USP and the conductive pattern CP.

The upper buried insulating pattern UVI may be apart from the upper insulating pattern UVP with the upper semiconductor pattern USP therebetween. The upper buried insulating pattern UVI may cover the inner side surface of the upper semiconductor pattern USP. The upper buried insulating pattern UVI may have a cylindrical shape. The upper buried insulating pattern UVI may extend from the inside of the upper hole H to the inside of the lower hole LH. The upper buried insulating pattern UVI may cover a portion of the upper surface of the conductive pattern CP.

The upper insulating pattern UVP may cover an outer surface of the upper semiconductor pattern USP. The upper insulating pattern UVP may include one thin layer or a plurality of thin layers.

Referring to FIG. 7B, the upper insulating pattern UVP may include an upper tunnel insulating layer TL1, an upper charge storage layer CL1, and an upper blocking insulating layer BIL1.

The upper charge storage layer CL1 may include, for example, an insulating layer including a trap insulating layer, a floating gate electrode, or conductive nanodots. The upper charge storage layer CL1 may include at least one of a silicon nitride layer, a silicon oxynitride layer, a silicon-rich nitride layer, a nano-crystalline Si layer, and a laminated trap layer. The upper tunnel insulating layer TL1 may include a material having a band gap greater than that of the upper charge storage layer CL1. The upper tunnel insulating layer TL1 may include a high dielectric layer, such as an aluminum oxide layer and a hafnium oxide layer, or a silicon oxide layer. The upper blocking insulating layer BIL1 may include a silicon oxide layer and/or an aluminum oxide layer.

The upper conductive pad UPD may cover an upper surface of the upper semiconductor pattern USP and an upper surface of the upper buried insulating pattern UVI. The upper conductive pad UPD may include an impurity-doped semiconductor material and/or a metal material.

Referring to FIGS. 5 and 7A again, upper separation patterns UPS crossing the upper horizontal electrode UHL in the second horizontal direction D2 may be provided. The upper separation patterns UPS may separate the upper horizontal electrode UHL on one electrode structure ST into two electrodes electrically insulated from each other. The upper separation patterns UPS may be provided in a trench T penetrating the upper horizontal electrode UHL and the first interlayer insulating layer 131. Inner side surfaces of the trench T may be defined by the second insulating layer 122, the upper horizontal electrode UHL, and the first interlayer insulating layer 131. A bottom of the trench T may be defined by the second insulating layer 122. The bottom of the trench T may be at a lower vertical level than the lower surface of the upper horizontal electrode UHL. The upper surface of the upper separation patterns UPS may be covered by the second interlayer insulating layer 141.

The upper separation patterns UPS may have a length in the second horizontal direction D2, that is not less than that of the upper horizontal electrode UHL. The upper separation patterns UPS may completely cross the upper horizontal electrode UHL.

Each of the upper separation patterns UPS may include a barrier layer BI and a buried semiconductor pattern BS. The barrier layer BI may be provided on an inner surface of the trench T, and may surround an outer side surface and a lower surface of the buried semiconductor pattern BS. The buried semiconductor pattern BS may be buried in the barrier layer BI. The buried semiconductor pattern BS may be apart from the upper horizontal electrode UHL with the barrier layer BI therebetween.

Referring to FIG. 7B, the barrier layer BI may have layer similar to that of the upper insulating pattern UVP. For example, the barrier layer BI may include the upper tunnel insulating layer TL1, the upper charge storage layer CL1, and the upper blocking insulating layer BIL1. The buried semiconductor pattern BS may include a semiconductor material, such as Si and Ge, or a mixture thereof. In addition, the upper semiconductor pattern USP may also include an impurity-doped semiconductor or an intrinsic semiconductor not in an impurity-doped state.

The upper separation pattern UPS may have a width w2 less than a width w1 of the upper channel structure UCS. For example, the width w2 of the upper separation pattern UPS may have a value in a range of about 0.1 to about 0.5 times the width w1 of the upper channel structure UCS. The width w2 of the upper separation pattern UPS may not exceed twice the sum of the thicknesses of the upper insulating pattern UVP and the upper semiconductor pattern USP. The width w2 of the upper separation pattern UPS may be less than a width W3 of the conductive pattern CP. In inventive concepts, a width may refer to the length in the first horizontal direction D1 of a corresponding component unless otherwise specified.

The bit lines BLs may be provided on the second interlayer insulating layer 141. Contact plugs BPLG may penetrate the second interlayer insulating layer 141, and may be connected to upper conductive pads UPD, respectively. The bit lines BL may extend in parallel with each other in the first horizontal direction D1. The bit lines BLs may be electrically connected to upper channel structures UCS via contact plugs BPLG, respectively.

The cell contact plugs CPLG may be connected to the lower and upper electrodes EL1 and EL2 forming a stepped structure in the connection region CNR, respectively. Some of the cell contact plugs CPLG may be connected to the upper horizontal electrodes UHL. The lower and upper electrodes EL1 and EL2 and the upper horizontal electrodes UHL may be electrically connected to the peripheral circuit structure PS via the cell contact plugs CPLG.

Referring to FIGS. 5 and 7A again, outside structure OS may be arranged on the peripheral circuit insulating layer 50. The outside structure OS may include an insulating substrate 200, the dummy stacked structure DST, and dummy vertical structures DVS.

In the outside region OR, the insulating substrate 200 may be arranged on the upper surface of the peripheral circuit insulating layer 50. The insulating substrate 200 may include, for example, one of silicon oxide, silicon nitride, and silicon oxynitride. The insulating substrate 200 may include an upper surface extending in the first horizontal direction D1 and the second horizontal direction D2. In some embodiments, the insulating substrate 200 may be at the same vertical level as the cell substrate 100 of the cell structure CS in the cell region CAR. For example, a lower surface of the insulating substrate 200 may be at the same vertical level as a lower surface of the cell substrate 100. For example, an upper surface of the insulating substrate 200 may be at the same vertical level as the upper surface of the cell substrate 100. The insulating substrate 200 may be in contact with the peripheral circuit insulating layer 50.

A third insulating layer 201 and the fourth insulating layer 202 may be arranged between the dummy stacked structure DST and the insulating substrate 200. The third insulating layer 201 and the fourth insulating layer 202 may be in parallel with the upper surface of the insulating substrate 200, and may extend in parallel with the dummy stacked structure DST in the first horizontal direction D1 and the second horizontal direction D2. The third insulating layer 201 and the fourth insulating layer 202 may be sequentially stacked on the insulating substrate 200. The third insulating layer 201 and the fourth insulating layer 202 may include an insulating material. For example, the third insulating layer 201 and the fourth insulating layer 202 may include one of silicon oxide, silicon nitride, and silicon oxynitride. In some embodiments, the third insulating layer 201 and/or the fourth insulating layer 202 may be at the same vertical level as the first horizontal pattern SCP1 and/or the second horizontal pattern SCP2 of the cell structure CS in the cell region CAR. For example, upper and lower surfaces of the third insulating layer 201 may be at the same vertical level as upper and lower surfaces of the first horizontal pattern SCP1, respectively. For example, upper and lower surfaces of the fourth insulating layer 202 may be at the same vertical level as upper and lower surfaces of the second horizontal pattern SCP2, respectively.

The dummy stacked structure DST may be arranged on the insulating substrate 200. The dummy stacked structure DST may be apart from the insulating substrate 200 with the third insulating layer 201 and the fourth insulating layer 202 therebetween. The dummy stacked structure DST may be apart from the peripheral circuit structure PS with the insulating substrate 200, the third insulating layer 201, and the fourth insulating layer 202 therebetween.

The dummy stacked structure DST may include a lower dummy stacked structure DST1, in which a lower dummy pattern DP1 and the lower mold insulating layer ILD1 are alternately stacked in the direction D3 vertical to the upper surface of the insulating substrate 200, and an upper dummy stacked structure DST2, in which an upper dummy pattern DP2 and the upper mold insulating layer ILD2 are alternately stacked on the lower dummy stacked structure DST1. Thicknesses of the lower and upper dummy patterns DP1 and DP2 may be substantially the same as each other, and thicknesses of the lower and upper mold insulating layers ILD1 and ILD2 may vary depending on characteristics of a semiconductor device. For example, the lower and upper mold insulating layers ILD1 and ILD2 on upper surfaces of the uppermost lower and upper dummy patterns DP1 and DP2 of each of the lower and upper dummy stacked structures DST1 and DST2 among the lower and upper mold insulating layers ILD1 and ILD2 may be thicker than other lower and upper mold insulating layers ILD1 and ILD2, respectively. The lower and upper dummy patterns DP1 and DP2 may respectively include the lower and upper mold insulating layers ILD1 and ILD2 and a material having etching selectivity. The lower and upper dummy patterns DP1 and DP2 may include, for example, a silicon nitride layer or a silicon oxynitride layer. Each of the lower and upper mold insulating layers ILD1 and ILD2 may include a silicon oxide layer.

In the outside region OR, a plurality of dummy vertical structures DVS penetrating the dummy stacked structure DST may be provided. The dummy vertical structures DVS may be arranged in the first horizontal direction D1 and the second horizontal direction D2. The dummy vertical structures DVS may be arranged adjacent to through electrodes THV. In some embodiments, the dummy vertical structures DVS may be arranged to surround the through electrodes THV in a plan view.

Referring to FIGS. 5, 6A through 6D, a plurality of dummy vertical structures DVS may be arranged to surround the through electrodes THV in a plan view.

In some embodiments, as illustrated in FIG. 5, the plurality of dummy vertical structures DVS may be arranged in the first horizontal direction D1 and the second horizontal direction D2 with the through electrodes THV therebetween. The plurality of dummy vertical structures DVS may be arranged in a straight line with the through electrodes THV in the first horizontal direction D1 and the second horizontal direction D2. For example, four dummy vertical structures DVS may be arranged to surround one through electrode THV.

Figure 6A:
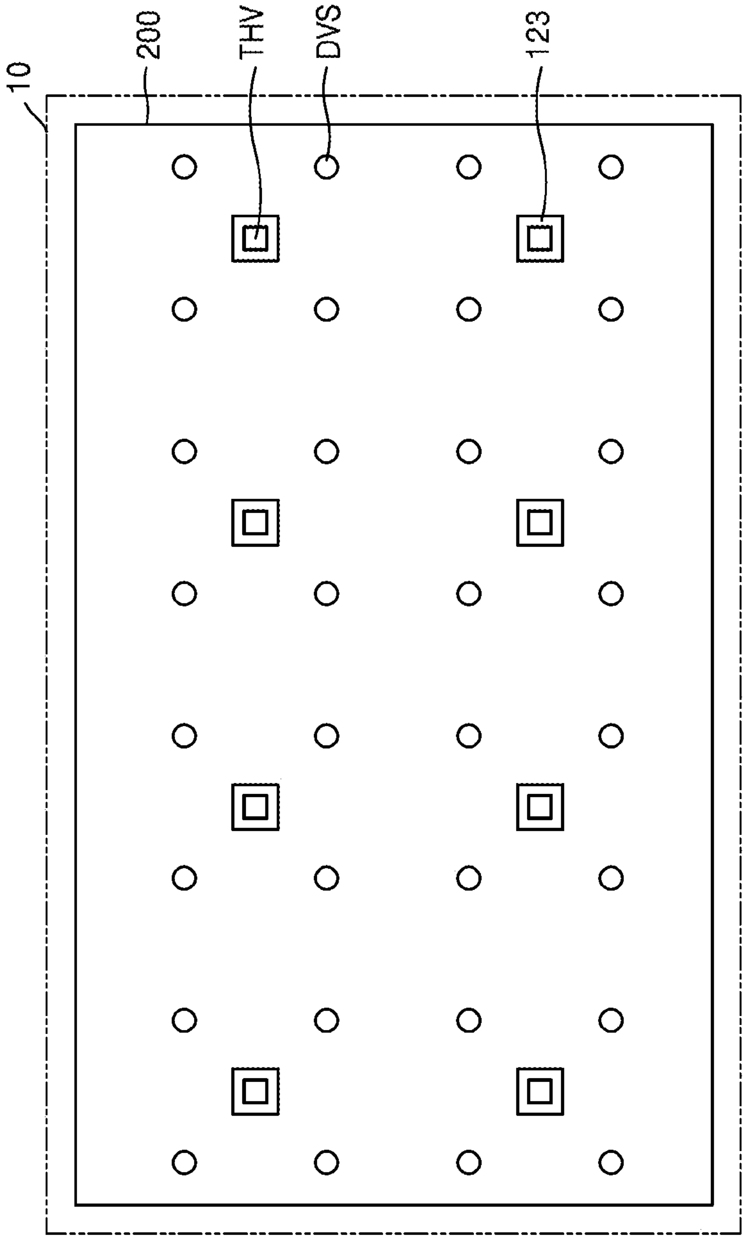
FIGS. 6A through 6D are enlarged plan views of an external region of a semiconductor device, according to embodiments.
Figure 7A:
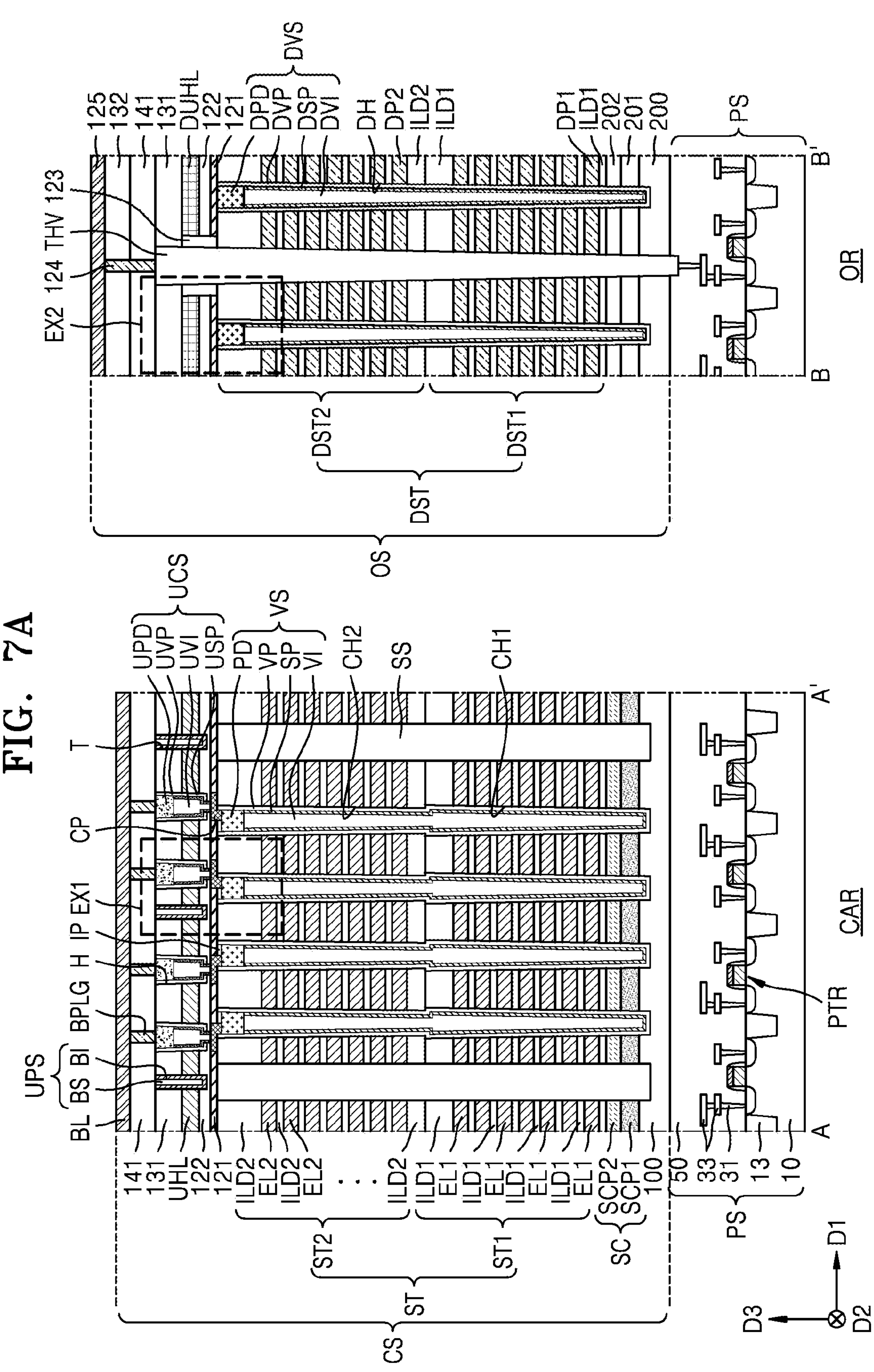
FIG. 7A is a cross-sectional view of a cell region and an external region of a semiconductor device taken along lines A-A' and B-B' in FIG. 5, according to embodiments.
Figure 7B:
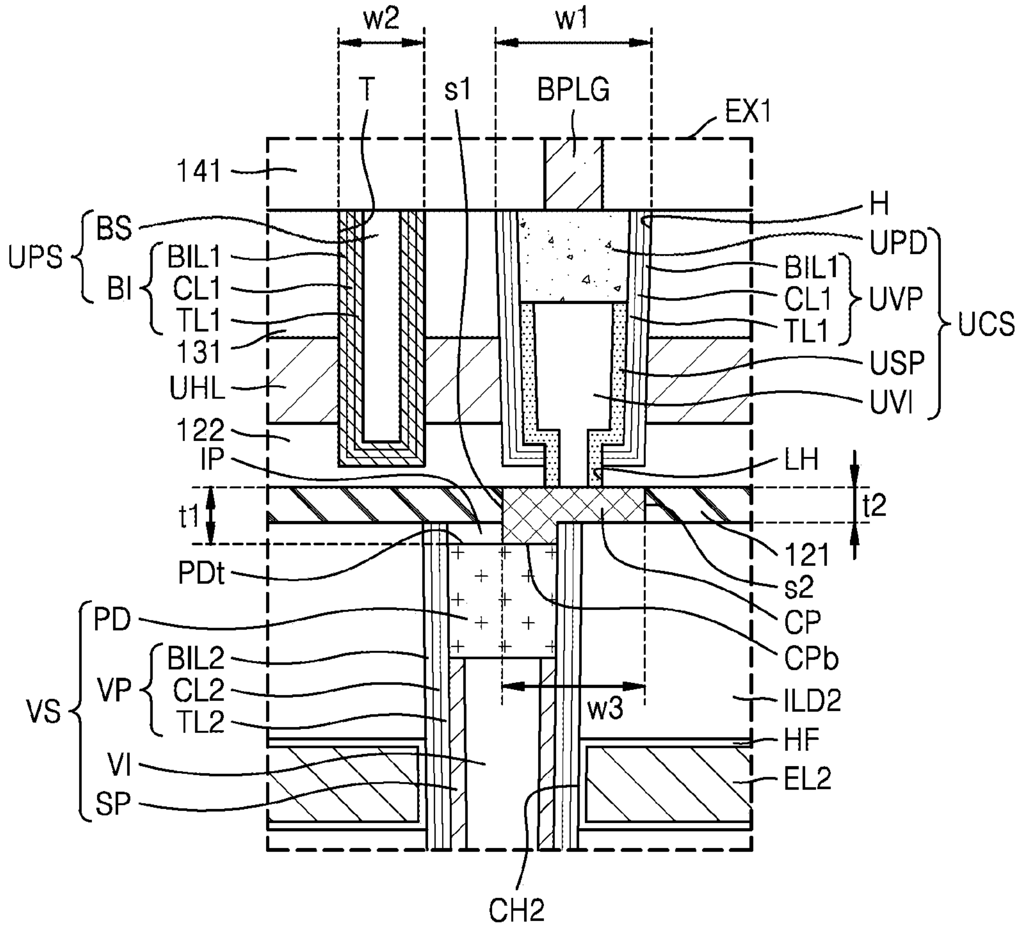
FIGS. 7B and 7C are enlarged cross-sectional views of a region EX1 and a region EX2 in FIG. 7A, respectively.
Figure 7C:
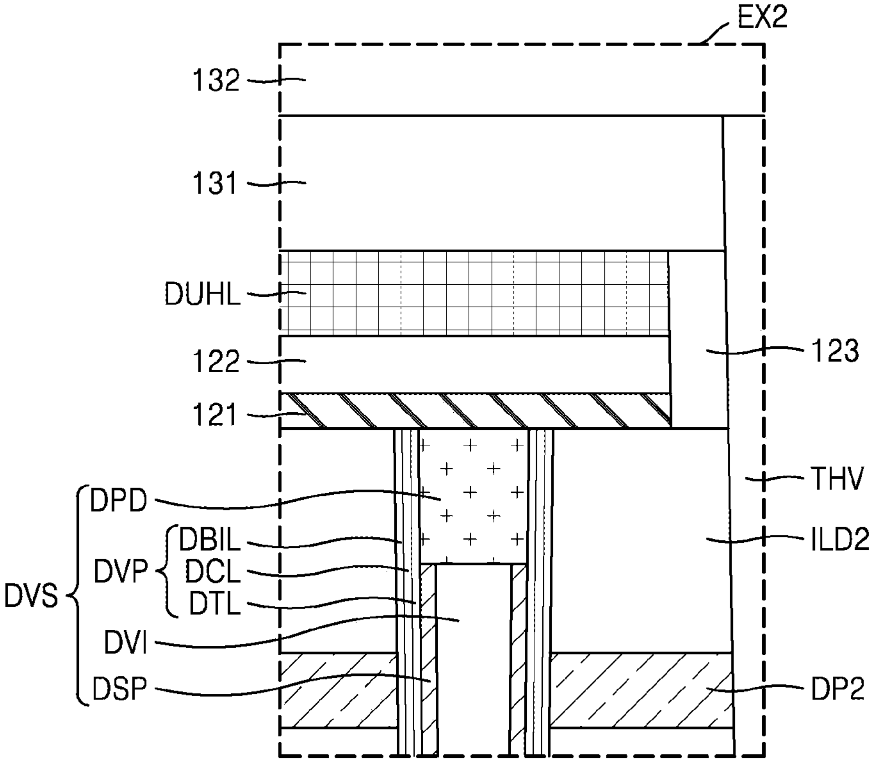

In some embodiments, as illustrated in FIG. 6A, a plurality of dummy vertical structures DVS may be arranged in a diagonal direction with the through electrode THV therebetween. For example, four dummy vertical structures DVS may be arranged to surround one through electrode THV.

Figure 6B:
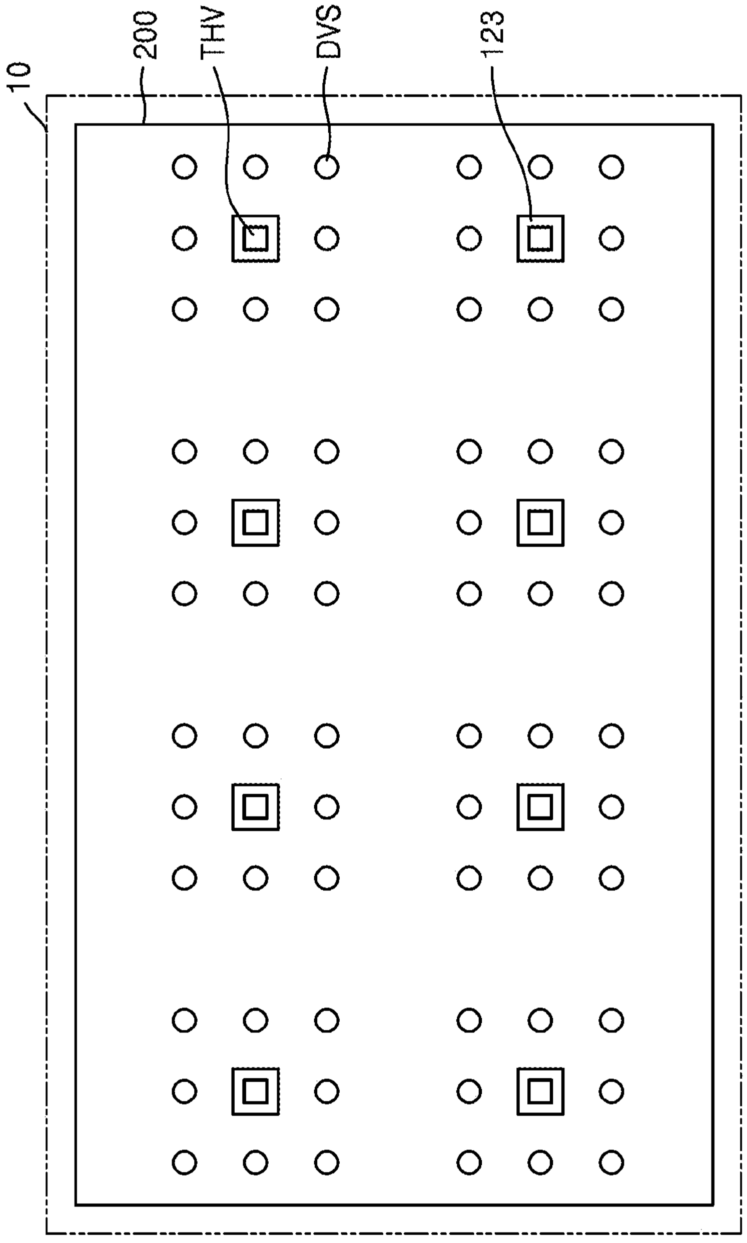

In some embodiments, as illustrated in FIG. 6B, a plurality of dummy vertical structures DVS may be arranged in the first horizontal direction D1, the second horizontal direction D2, and a diagonal direction with the through electrode THV therebetween. For example, eight dummy vertical structures DVS may be arranged to surround one through electrode THV.

Figure 6C:
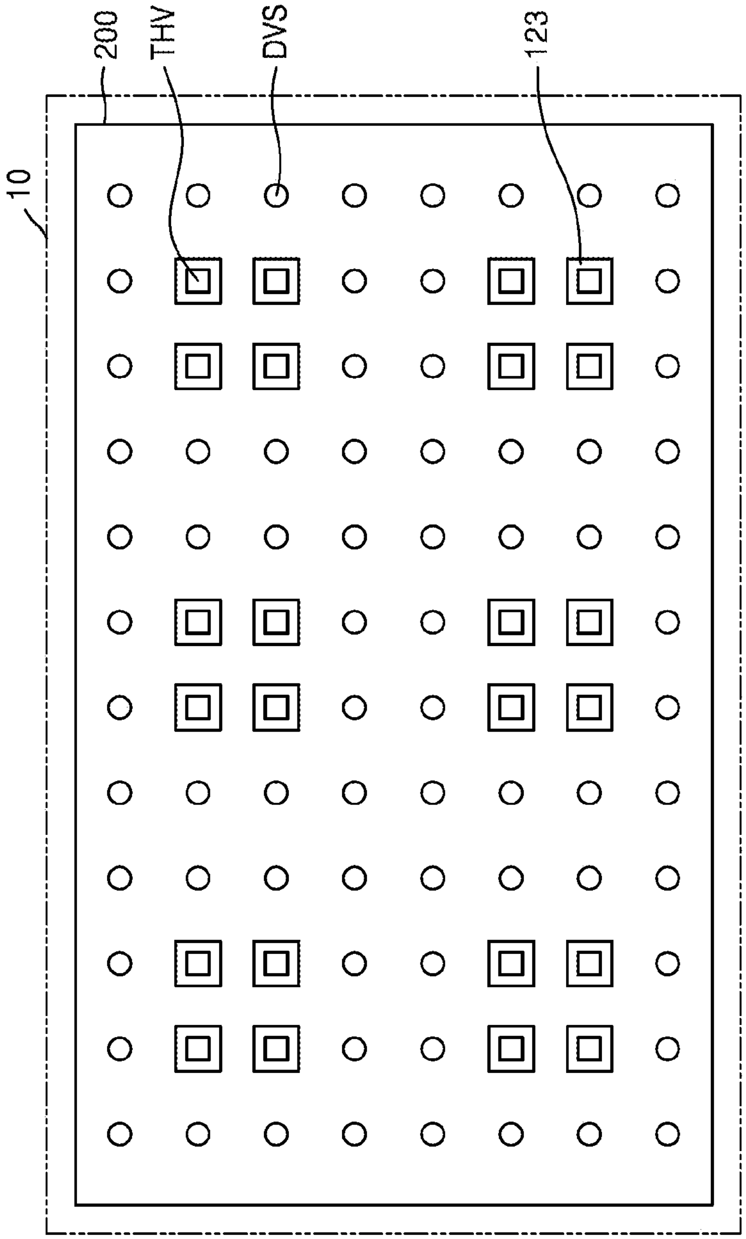

In some embodiments, as illustrated in FIG. 6C, a plurality of dummy vertical structures DVS may be arranged in the first horizontal direction D1, the second horizontal direction D2, and a diagonal direction with a plurality of through electrodes THV therebetween. For example, the plurality of through electrodes THV may be arranged in the first horizontal direction D1 and the second horizontal direction D2, and may be arranged so that the plurality of dummy vertical structures DVS surround the plurality of through electrodes THV. For example, twelve dummy vertical structures DVS may be arranged to surround four through electrodes THV.

Figure 6D:
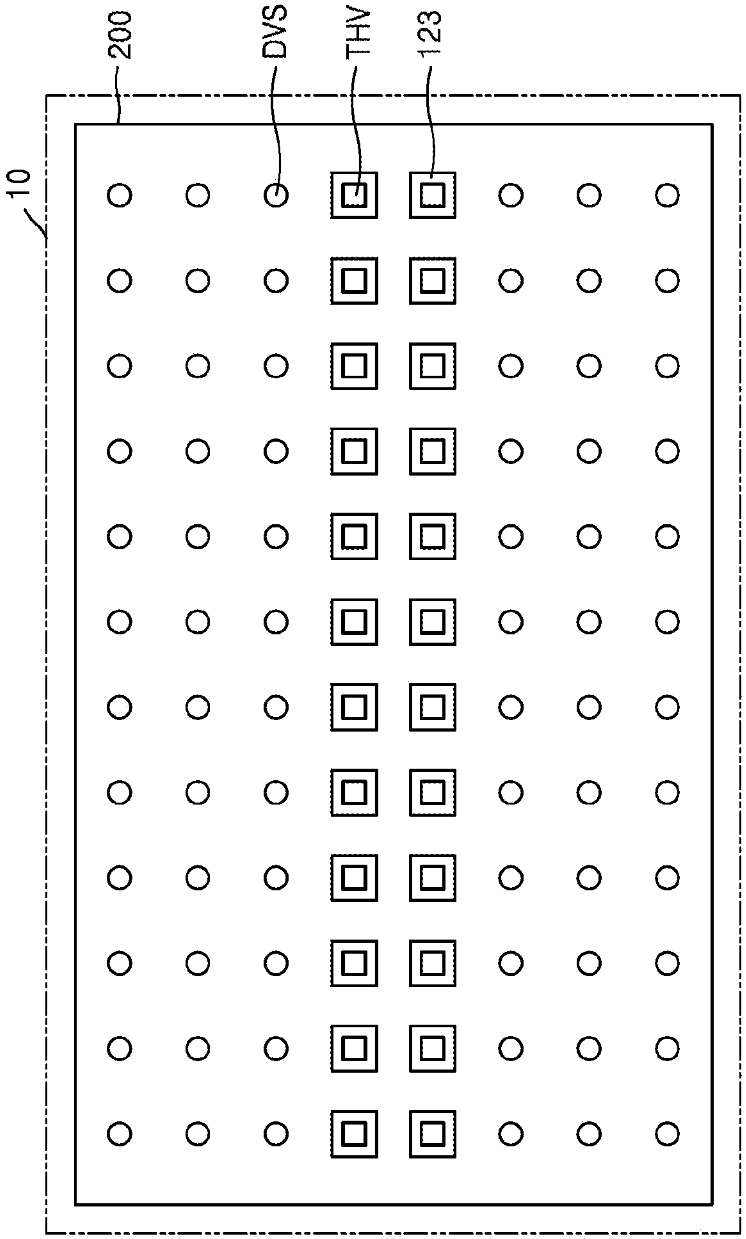

In some embodiments, as illustrated in FIG. 6D, a plurality of dummy vertical structures DVS may be arranged in the first horizontal direction D1 and the second horizontal direction D2 with a plurality of through electrodes THV therebetween. The plurality of dummy vertical structures DVS may be arranged in a straight line with the plurality of through electrodes THV in the second horizontal direction D2. For example, the plurality of through electrodes THV may be arranged in the first horizontal direction D1, and the plurality of dummy vertical structures DVS may be arranged to fill both sides thereof.

The arrangement of the through electrode THV and the plurality of dummy vertical structures DVS illustrated in FIGS. 6A to 6D is an example, but is not limited there, and may be set in various manners.

Referring to FIGS. 5 and 7A again, the dummy vertical structure DVS may penetrate the dummy stacked structure DST. In other words, the dummy vertical structure DVS may penetrate the lower dummy stacked structure DST1 and the upper dummy stacked structure DST2. In some embodiments, the dummy vertical structure DVS may penetrate at least a portion of the dummy stacked structure DST. For example, the dummy vertical structure DVS may penetrate the upper dummy stacked structure DST2, and may penetrate a portion of the lower dummy stacked structure DST1. For example, the dummy vertical structure DVS may penetrate a portion of the upper dummy stacked structure DST2. In some embodiments, the dummy vertical structure DVS may penetrate the dummy stacked structure DST from an upper portion thereof. In other words, the dummy vertical structure DVS may penetrate the upper dummy stacked structure DST2, and may penetrate a portion of the lower dummy stacked structure DST1 from an upper portion thereof. In other words, the dummy vertical structure DVS may penetrate a portion of the upper dummy stacked structure DST2 from an upper portion thereof.

In some embodiments, the dummy vertical structure DVS may be configured not to be electrically connected to the peripheral circuit structure PS. In some embodiments, the dummy vertical structure DVS may be apart from the peripheral circuit structure PS with an insulating layer therebetween. The dummy vertical structure DVS may be apart from the peripheral circuit structure PS with at least some of the insulating substrate 200, the third insulating layer 201, and the fourth insulating layer 202 therebetween. For example, the dummy vertical structure DVS may be apart from the peripheral circuit structure PS with a portion of the insulating substrate 200 therebetween.

An upper surface of the dummy vertical structure DVS may be at the same vertical level as the upper surface of the uppermost upper mold insulating layer ILD2 among the lower and upper mold insulating layers ILD1 and ILD2 of the upper dummy stacked structure DST2. The upper surface of the dummy vertical structure DVS may be at the same vertical level as the upper surface of the channel structure VS. A lower surface of the dummy vertical structure DVS may be at a lower vertical level than the upper surface of the insulating substrate 200. The lower surface of the dummy vertical structure DVS may be at a vertical level equal to or higher than the lower surface of the channel structure VS. In some embodiments, a vertical height of the dummy vertical structure DVS may be equal to or less than a vertical height of the channel structure VS.

The diameter of the dummy vertical structure DVS may include a portion in which the width thereof gradually decreases toward the peripheral circuit board 10. For example, the diameter in the horizontal direction of the dummy vertical structure DVS may include a portion, which penetrates the upper dummy stacked structure DST2 and gradually decreases. For example, the diameter in the horizontal direction of the dummy vertical structure DVS may include a portion, which penetrates the lower dummy stacked structure DST1 and gradually decreases.

The diameter in the horizontal direction of the dummy vertical structure DVS may penetrate the dummy stacked structure DST and continuously change. The diameter in the horizontal direction of the dummy vertical structure DVS may continuously change at a boundary of the upper dummy stacked structure DST2 and the lower dummy stacked structure DST1. For example, the diameter in the horizontal direction of the dummy vertical structure DVS may continuously decrease in the upper dummy stacked structure DST2 and the lower dummy stacked structure DST1, and at the boundary of the upper dummy stacked structure DST2 and the lower dummy stacked structure DST1. In some embodiments, a sidewall of the dummy vertical structure DVS may not have a step at a boundary of the upper dummy stacked structure DST2 and the lower dummy stacked structure DST1. In other words, the dummy vertical structure DVS may not have a bent unit at the boundary of the upper dummy stacked structure DST2 and the lower dummy stacked structure DST1.

Each of the dummy vertical structures DVS may include a dummy gate dielectric layer DVP, a dummy channel layer DSP, a dummy channel buried insulating layer DVI, and a dummy channel pad DPD. The dummy gate dielectric layer DVP, the dummy channel layer DSP, and the dummy channel buried insulating layer DVI may be sequentially provided on the inner side surface of a hole DH penetrating the dummy stacked structure DST. The dummy channel pad DPD may be provided on the dummy channel buried insulating layer DVI and the dummy channel layer DSP.

The dummy vertical structure DVS may include the same component as the channel structure VS. For example, the dummy gate dielectric layer DVP, the dummy channel layer DSP, the dummy channel buried insulating layer DVI, and the dummy channel pad DPD, which are included in the dummy vertical structure DVS, may include the same material as the channel insulating pattern VP, the channel semiconductor pattern SP, the buried insulating pattern VI, and the conductive pad PD, which are included in the channel structure VS of the cell region CAR, respectively. For example, the dummy gate dielectric layer DVP, the dummy channel layer DSP, the dummy channel buried insulating layer DVI, and the dummy channel pad DPD may be arranged in the same manner as the channel insulating pattern VP, the channel semiconductor pattern SP, the buried insulating pattern VI, and the conductive pad PD, respectively. In some embodiments, the dummy vertical structure DVS may be formed simultaneously with the channel structure VS. In other words, the dummy gate dielectric layer DVP, the dummy channel layer DSP, the dummy channel buried insulating layer DVI, and the dummy channel pad DPD, which are included in the dummy vertical structure DVS, may be substantially the same as the channel insulating pattern VP, the channel semiconductor pattern SP, the buried insulating pattern VI, and the conductive pad PD, which are included in the channel structure VS of the cell region CAR, respectively.

In some embodiments, the dummy gate dielectric layer DVP may include one thin layer or a plurality of thin layers, like the channel insulating pattern VP. Referring to FIG. 7C, the dummy gate dielectric layer DVP may include a dummy tunnel insulating layer DTL, a dummy charge storage layer DCL, and a dummy blocking insulating layer DBIL.

The dummy charge storage layer DCL may include an insulating layer including a trap insulating layer, a floating gate electrode, or conductive nanodots. The dummy charge storage layer DCL may include at least one of a silicon nitride layer, a silicon oxynitride layer, a silicon-rich nitride layer, a nano-crystalline Si layer, and a laminated trap layer. The dummy tunnel insulating layer DTL may include a material having a band gap greater than that of the charge storage layer. The dummy tunnel insulating layer DTL may include a high dielectric layer, such as an aluminum oxide layer and a hafnium oxide layer, or a silicon oxide layer. The dummy blocking insulating layer DBIL may include a silicon oxide layer and/or an aluminum oxide layer.

Referring to FIGS. 7A and 7C, the first insulating layer 121 may be arranged on the dummy stacked structure DST. The first insulating layer 121 may be on the upper surface of the uppermost upper mold insulating layer ILD2 among the lower and upper mold insulating layers ILD1 and ILD2 of the dummy stacked structure DST. The first insulating layer 121 may cover the dummy vertical structures DVS. The first insulating layer 121 may include the lower and upper mold insulating layers ILD1 and ILD2 and a material having etching selectivity. The first insulating layer 121 may include, for example, silicon nitride. The thickness of the first insulating layer 121 may be less than a thickness of the uppermost upper mold insulating layer ILD2 among the lower and upper mold insulating layers ILD1 and ILD2. In some embodiments, the first insulating layer 121 on the dummy stacked structure DST may be at the same vertical level as the first insulating layer 121 on the electrode structure ST. In some embodiments, the first insulating layer 121 on the dummy stacked structure DST may be substantially the same as the first insulating layer 121 on the electrode structure ST.

The second insulating layer 122 may be arranged on an upper surface of the first insulating layer 121. The second insulating layer 122 may have the thickness that is greater than that of the first insulating layer 121. The thickness of the second insulating layer 122 may be less than the thickness of the uppermost upper mold insulating layer ILD2 among the lower and upper mold insulating layers ILD1 and ILD2 of the dummy stacked structure DST. The second insulating layer 122 may include the first insulating layer 121 and a material having etching selectivity. The second insulating layer 122 may include, for example, silicon nitride. The second insulating layer 122 may not contact dummy channel pads DPD of the dummy vertical structure DVS. The second insulating layer 122 may be apart from the dummy vertical structures DVS with the first insulating layer 121 therebetween. In some embodiments, the second insulating layer 122 on the dummy stacked structure DST may be at the same vertical level as the second insulating layer 122 on the electrode structure ST. In some embodiments, the second insulating layer 122 on the dummy stacked structure DST may be substantially the same as the second insulating layer 122 on the electrode structure ST.

A dummy upper horizontal electrode DUHL may be provided on the second insulating layer 122. The dummy upper horizontal electrode DUHL may partially overlap the dummy stacked structure DST. The dummy upper horizontal electrode DUHL may be in the outside region OR. The dummy upper horizontal electrode DUHL may extend from the outside region OR to the connection region CNR, and may be on some of the dummy structures DS. The dummy upper horizontal electrode DUHL may not completely cover the connection region CNR.

The dummy upper horizontal electrode DUHL may be vertically apart from the dummy vertical structures DVS with the first insulating layer 121 and the second insulating layer 122 therebetween. In other words, a lower surface of the dummy upper horizontal electrode DUHL may be at a higher vertical level than the upper surfaces of the dummy vertical structures DVS. The dummy upper horizontal electrode DUHL may have a thickness that is greater than that of each of the first insulating layer 121 and the second insulating layer 122. In some embodiments, the dummy upper horizontal electrode DUHL on the dummy stacked structure DST may be at the same vertical level as the upper horizontal electrode UHL on the electrode structure ST.

The first interlayer insulating layer 131 and the second interlayer insulating layer 141 may be sequentially stacked on the dummy upper horizontal electrode DUHL. The first interlayer insulating layer 131 and the second interlayer insulating layer 141 may include, for example, one of silicon oxide, silicon nitride, and silicon oxynitride. According to some embodiments, the first interlayer insulating layer 131 and the second interlayer insulating layer 141 may be connected to each other, and may form one body. In other words, the interface between the first interlayer insulating layer 131 and the second interlayer insulating layer 141 may not be differentiated. In some embodiments, the first interlayer insulating layer 131 and the second interlayer insulating layer 141 on the dummy stacked structure DST may be at the same vertical level as the first interlayer insulating layer 131 and the second interlayer insulating layer 141 on the electrode structure ST. In some embodiments, the first interlayer insulating layer 131 and the second interlayer insulating layer 141 on the dummy stacked structure DST may be substantially the same as the first interlayer insulating layer 131 and the second interlayer insulating layer 141 on the electrode structure ST, respectively.

The through electrode THV penetrating the dummy stacked structure DST may be arranged on the outside region OR of the peripheral circuit board 10. The through electrode THV may sequentially penetrate the first interlayer insulating layer 131, the dummy upper horizontal electrode DUHL, the first insulating layer 121, the second insulating layer 122, the dummy stacked structure DST, the third insulating layer 201, the fourth insulating layer 202, and the insulating substrate 200, and may be connected to the peripheral circuit structure PS. The through electrode THV may partially penetrate the peripheral circuit insulating layer 50 of the peripheral circuit structure PS from the top portion thereof, and may be connected to the peripheral circuit wirings 33 of the peripheral circuit structure PS. The through electrode THV may be connected to the uppermost peripheral circuit wiring 33 among the peripheral circuit wirings 33 of the peripheral circuit structure PS. The through electrode THV may be electrically connected to the peripheral circuit structure PS.

A lower surface of the through electrode THV may be at a lower vertical level than a lower surface of the insulating substrate 200. The lower surface of the through electrode THV may be at a vertical level lower than the upper surface of the peripheral circuit structure PS. The lower surface of the through electrode THV may be at a vertical level lower than the upper surface of the peripheral circuit insulating layer 50. The upper surface of the through electrode THV may be at a vertical level higher than the upper surface of the dummy stacked structure DST. The upper surface of the through electrode THV may be at a vertical level higher than upper surfaces of the dummy upper horizontal electrode DUHL, the first insulating layer 121, and the second insulating layer 122. The upper surface of the through electrode THV may be at the same vertical level as an upper surface of the first interlayer insulating layer 131.

The through electrode THV may contact the first interlayer insulating layer, the lower and upper dummy patterns DP1 and DP2, the lower and upper mold insulating layers ILD1 and ILD2, the third insulating layer 201, the fourth insulating layer 202, the insulating substrate 200, and the peripheral circuit insulating layer 50. For example, the side of the through electrode THV may be defined by the lower and upper dummy patterns DP1 and DP2, the lower and upper mold insulating layers ILD1 and ILD2, the third insulating layer 201, the fourth insulating layer 202, the insulating substrate 200, and the peripheral circuit insulating layer 50. The lower surface of the through electrode THV may be defined by the peripheral circuit insulating layer 50. The through electrode THV may include a conductive material, for example, a semiconductor material, such as a metal, such as tungsten (W), cobalt (Co), and nickel (Ni), and Si, but is not limited thereto.

The through electrode THV may penetrate the dummy upper horizontal electrode DUHL, the first insulating layer 121, and the second insulating layer 122, but may not contact them. In some embodiments, the through electrodes THV may be apart from the dummy upper horizontal electrode DUHL, the first insulating layer 121, and the second insulating layer 122, with an insulating ring 123 therebetween. The through electrode THV may not overlap the dummy upper horizontal electrode DUHL in the vertical direction D3. The insulating ring 123 may include an insulating material. The insulating ring 123 may be arranged in a ring shape surrounding the through electrode THV. In FIG. 5, cross-sections of the insulating ring 123 and the through electrode THV are illustrated in a rectangular shape, but this is an example, and may have various other shapes.

A third interlayer insulating layer 132 and a wiring layer 125 may be arranged on the second interlayer insulating layer 141. A contact 124 penetrating the second interlayer insulating layer 141 and the third interlayer insulating layer 132 may be arranged. The contact 124 may electrically connect the through electrode THV to the wiring layer 125.

Figure 8A:
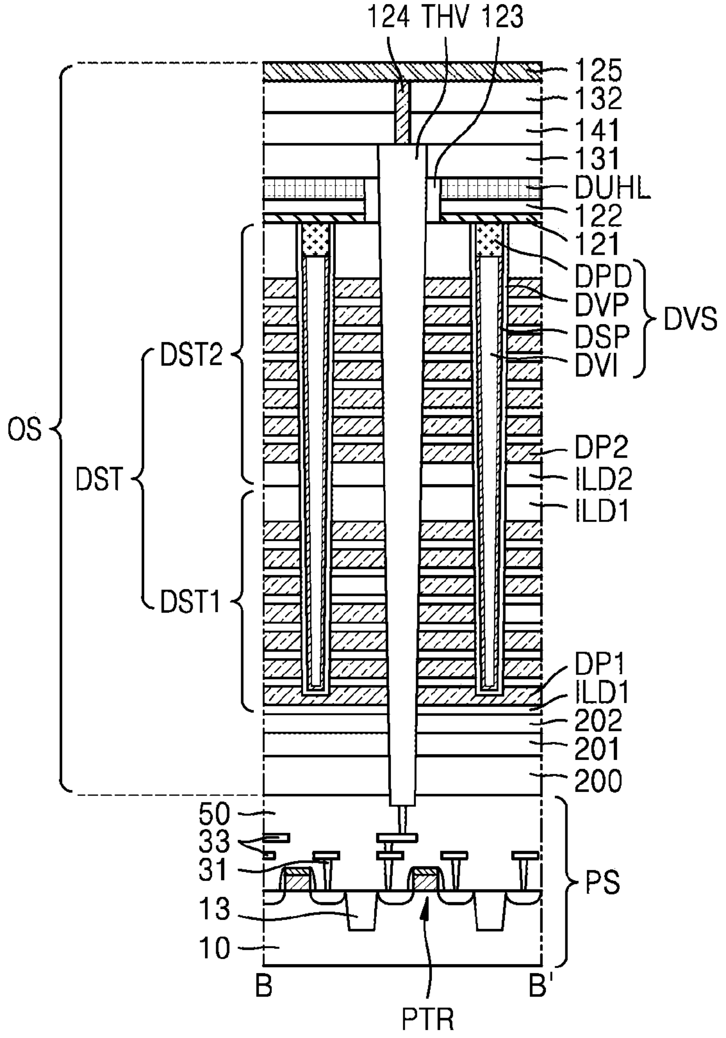
FIGS. 8A through 8C are cross-sectional views of an external region of a semiconductor device according to embodiments, taken along line B-B' in FIG. 5.
Figure 8B:
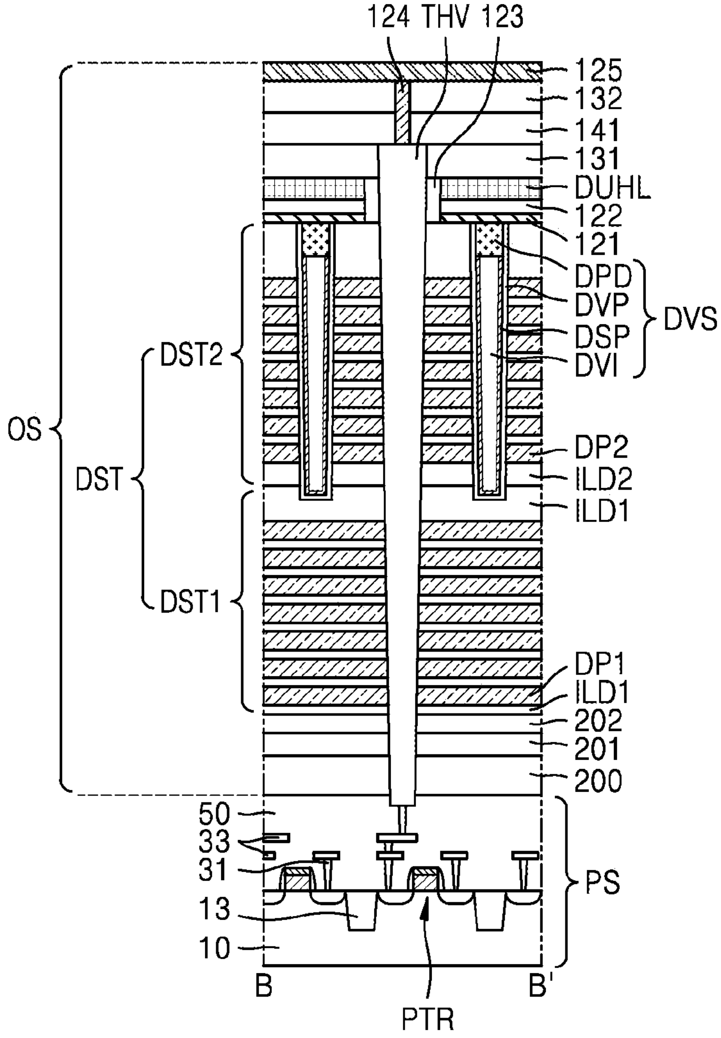
Figure 8C:
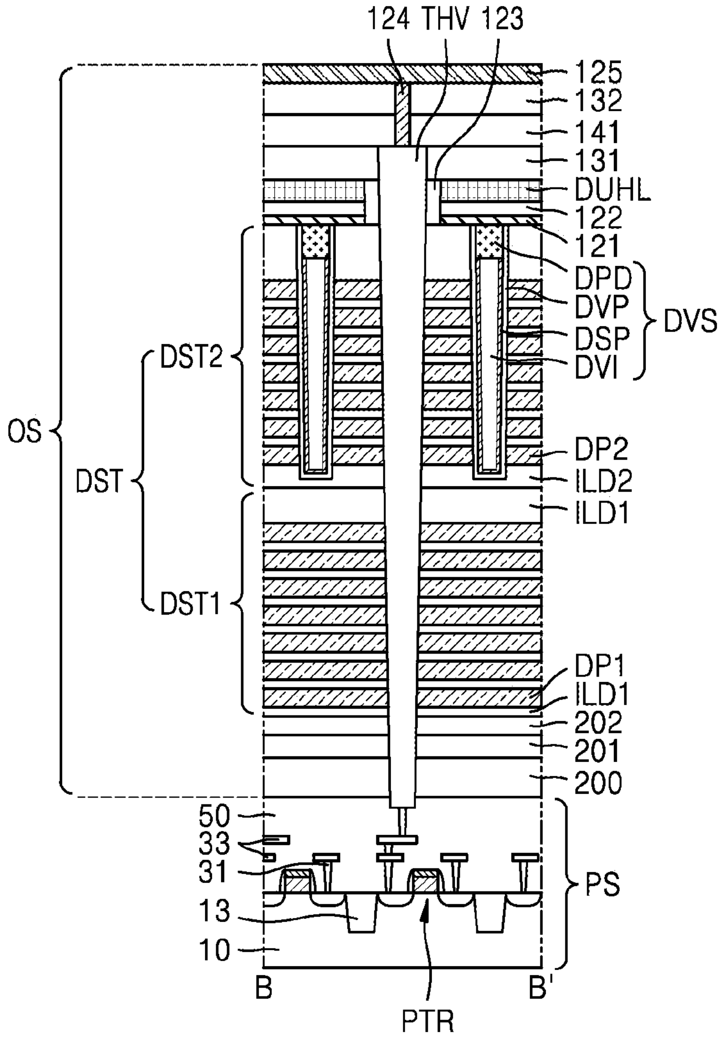

FIGS. 8A through 8C are cross-sectional views of an external region of a semiconductor device according to embodiments, taken along line B-B' in FIG. 5.

As described above, the dummy vertical structure DVS may penetrate at least a portion of the dummy stacked structure DST.

Referring to FIG. 8A, the dummy vertical structure DVS may penetrate the upper dummy stacked structure DST2, and may penetrate a portion of the lower dummy stacked structure DST1 from the upper portion thereof. In other words, the dummy vertical structure DVS may completely penetrate the upper dummy stacked structure DST2, but may not completely penetrate the lower dummy stacked structure DST1. In some embodiments, the lower surface of the dummy vertical structure DVS may be at a vertical level higher than the upper surface of the fourth insulating layer 202. The lower surface of the dummy vertical structure DVS may be arranged between a lower surface and an upper surface of the lower dummy stacked structure DST1. For example, the lower surface of the dummy vertical structure DVS may be arranged in the lower dummy pattern DPL. For example, the lower surface of the dummy vertical structure DVS may be arranged in the lower mold insulating layer ILD1. The dummy vertical structure DVS may be apart from the peripheral circuit structure PS with the insulating substrate 200, the third insulating layer 201, and the fourth insulating layer 202 therebetween.

Referring to FIG. 8B, the dummy vertical structure DVS may penetrate the upper dummy stacked structure DST2, and may penetrate some of the upper portion of the lower dummy stacked structure DST1 from the upper portion thereof. The dummy vertical structure DVS may penetrate the upper dummy stacked structure DST2, but may not completely penetrate the lower mold insulating layer ILD1 at the uppermost portion among the lower mold insulating layers ILD1 of the lower dummy stacked structure DST1. For example, the lower surface of the dummy vertical structure DVS may be arranged in the lower mold insulating layer ILD1 at the uppermost portion among the lower mold insulating layers ILD1. The dummy vertical structure DVS may be apart from the peripheral circuit structure PS with the insulating substrate 200, the fourth insulating layer 202, and the lower mold insulating layer ILD1 therebetween.

Referring to FIG. 8C, the dummy vertical structure DVS may penetrate a portion of the upper dummy stacked structure DST2 from the upper portion thereof. In other words, the dummy vertical structure DVS may not completely penetrate the upper dummy stacked structure DST2. In some embodiments, the lower surface of the dummy vertical structure DVS may be at a vertical level higher than the upper surface of the lower dummy stacked structure DST1. The lower surface of the dummy vertical structure DVS may be arranged between a lower surface and an upper surface of the upper dummy stacked structure DST2. For example, the lower surface of the dummy vertical structure DVS may be arranged in the upper dummy pattern DP2. For example, the lower surface of the dummy vertical structure DVS may be arranged in the upper mold insulating layer ILD2. The dummy vertical structure DVS may be apart from the peripheral circuit structure PS with the insulating substrate 200, the third insulating layer 201, the fourth insulating layer 202, and the lower dummy stacked structure DST1 therebetween.

FIGS. 9A through 9H are cross-sectional views illustrating a manufacturing method of a semiconductor device, according to embodiments.

Figure 9A:
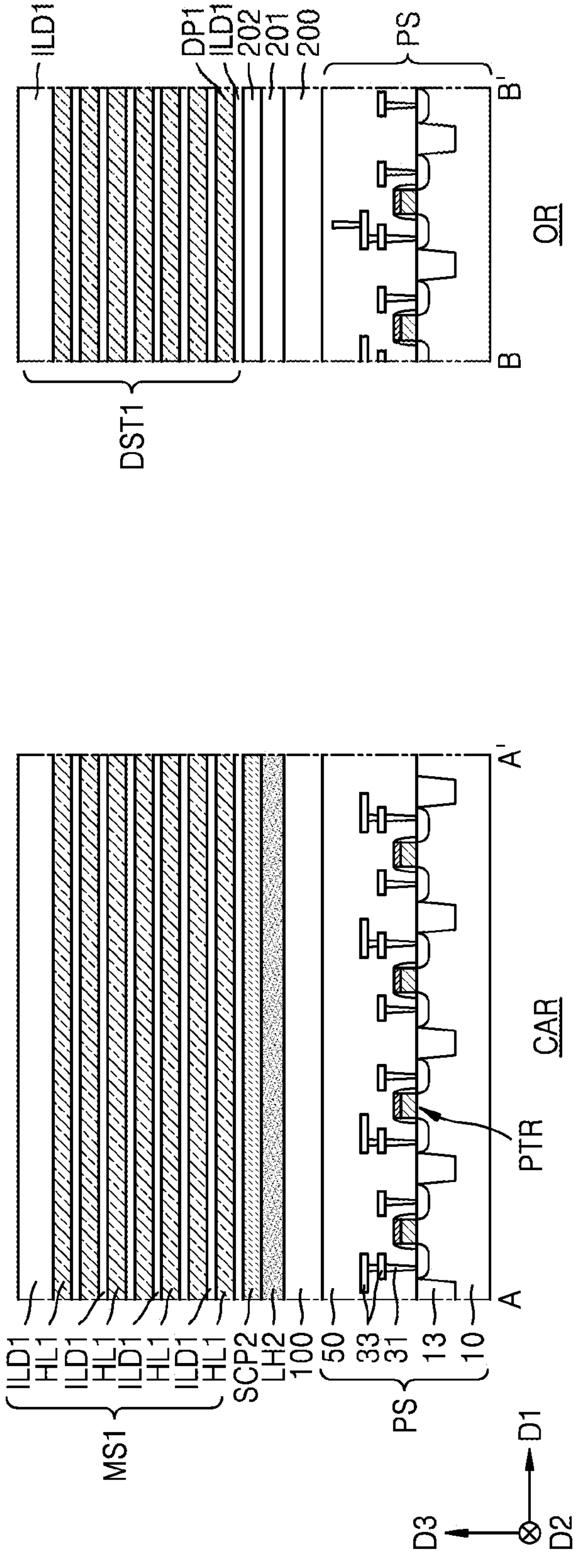
FIGS. 9A through 9H are cross-sectional views illustrating a manufacturing method of a semiconductor device, according to embodiments.

Referring to FIG. 9A, the peripheral circuit structure PS may be formed. Forming the peripheral circuit structure PS may include forming the peripheral circuit transistors PTR on the peripheral circuit board 10, forming the peripheral circuit wirings 33 and the peripheral circuit contact 31 on the peripheral circuit board 10, and forming the peripheral circuit insulating layer 50 on the peripheral circuit board 10. forming the peripheral circuit transistors PTR may include forming the peripheral circuit element isolation layer 13 defining active regions on the peripheral circuit board 10, forming a peripheral circuit gate insulating layer and a peripheral circuit gate electrode on the active regions, and forming a source/drain region by injecting impurities on the active regions. Forming the peripheral circuit insulating layer 50 may include forming an insulating layer covering the peripheral circuit transistors PTR, the peripheral circuit wirings 33, and the peripheral circuit contact 31, and flattening an upper surface of the insulating layer.

The cell substrate 100, a sacrificial layer LH2, and the second horizontal pattern SCP2 may be sequentially formed on the peripheral circuit insulating layer 50 of the cell region CAR. The sacrificial layer LH2 may include a silicon nitride layer or a silicon oxynitride layer. A lower mold structure MS1 may be formed on the second horizontal pattern SCP2. The lower mold structure MS1 may include the lower mold insulating layers ILD1 and the lower sacrificial layers HL1, which are alternately stacked. The lower sacrificial layers HL1 may include the lower mold insulating layers ILD1 and a material having etching selectivity. The lower sacrificial layers HL1 may include, for example, a silicon nitride layer or a silicon oxynitride layer.

The insulating substrate 200, the third insulating layer 201, and the fourth insulating layer 202 may be sequentially formed on the peripheral circuit insulating layer 50 of the outside region OR. The lower dummy stacked structure DST1 may be formed on the fourth insulating layer 202. The lower dummy stacked structure DST1 may include the lower mold insulating layers ILD1 and the lower dummy patterns DP1, which are alternately stacked. The lower dummy patterns DP1 may include the lower mold insulating layers ILD1 and a material having etching selectivity. The lower sacrificial layers HL1 may include, for example, a silicon nitride layer or a silicon oxynitride layer.

In some embodiments, the lower mold structure MS1 and the lower dummy stacked structure DST1 may be formed by using the same process. For example, the lower mold structure MS1 and the lower dummy stacked structure DST1 may be simultaneously formed. For example, the lower dummy patterns DP1 of the lower dummy stacked structure DST1 may include the same material as the lower sacrificial layers HL1 of the lower mold structure MS1. For example, the lower mold structure MS1 and the lower dummy stacked structure DST1 may be formed at the same vertical level.

Figure 9B:
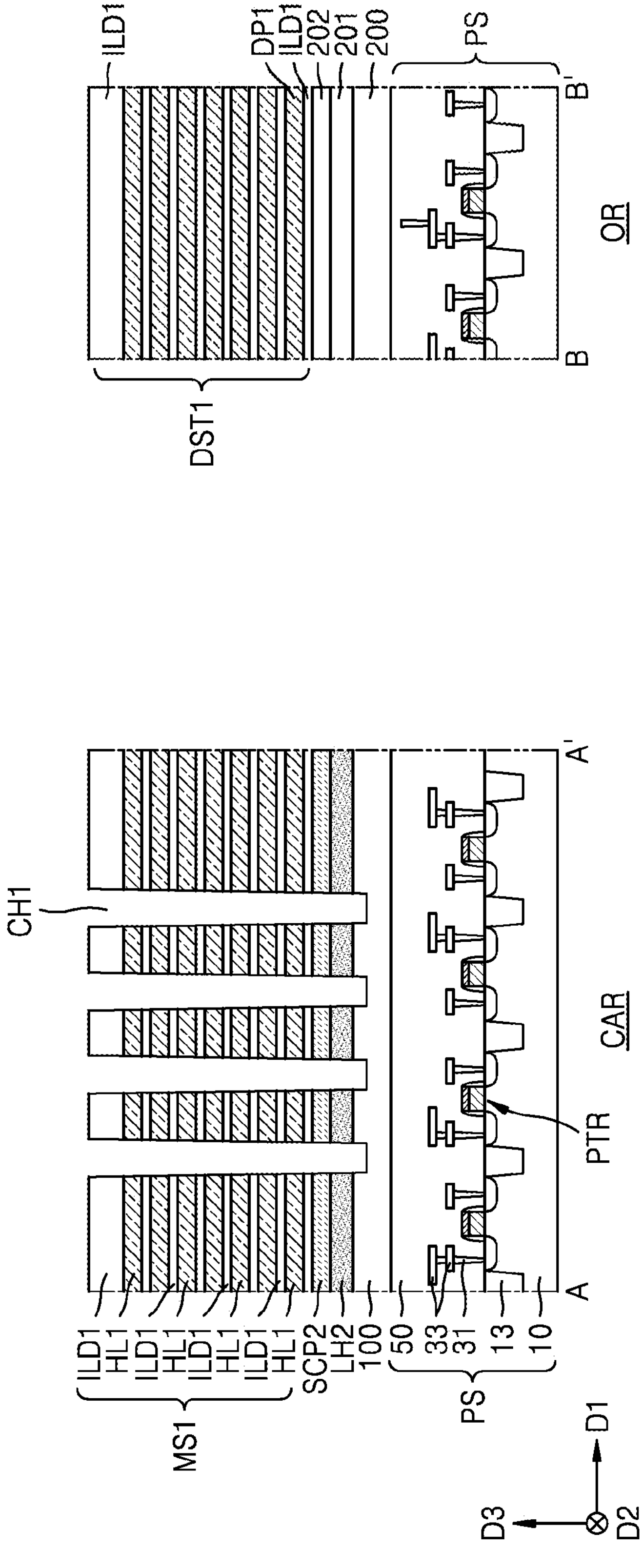

Referring to FIG. 9B, the lower channel hole CH1 penetrating the lower mold structure MS1 of the cell region CAR may be formed. The lower channel hole CH1 may be formed in a downward vertical direction from the upper portion of the lower mold structure MS1, sequentially penetrate the lower mold structure MS1, the second horizontal pattern SCP2, and the sacrificial layer LH2, and may be formed by etching a portion of the cell substrate 100.

Figure 9C:
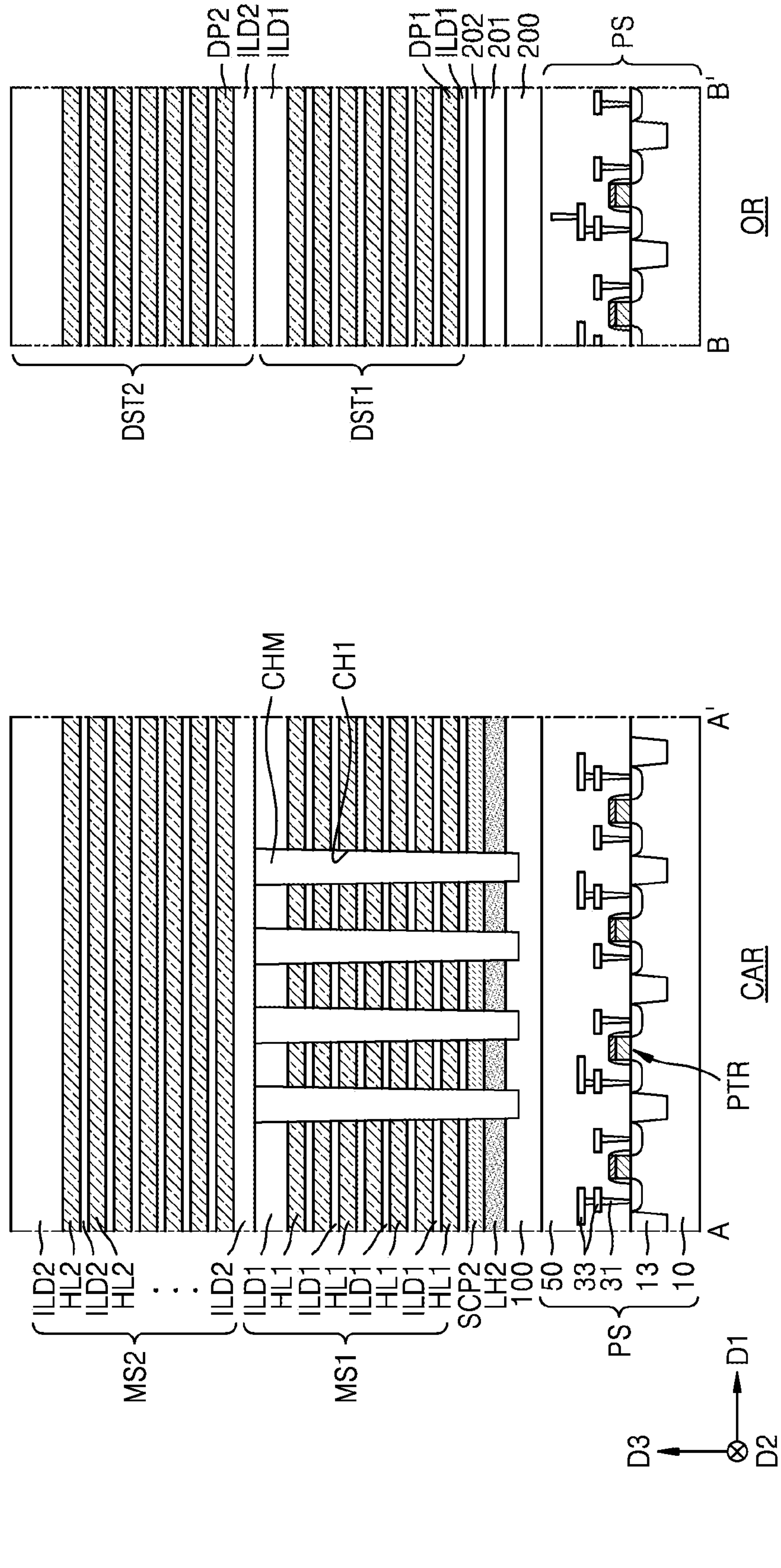

Referring to FIG. 9C, after a lower channel mold CHM filling the lower channel hole CH1 is formed, an upper mold structure MS2 may be formed on the lower mold structure MS1 of the cell region CAR. The upper mold structure MS2 may include the upper mold insulating layers ILD2 and an upper sacrificial layers HL2, which are alternately stacked. The upper mold insulating layers ILD2 and the upper sacrificial layers HL2 may be substantially the same as the lower mold insulating layers ILD1 and the lower sacrificial layers HL1, respectively.

The upper dummy stacked structure DST2 may be formed on the lower dummy stacked structure DST1 of the outside region OR. The upper dummy stacked structure DST2 may include the upper mold insulating layers ILD2 and the upper dummy patterns DP2, which are alternately stacked. The upper mold insulating layers ILD2 and the upper dummy patterns DP2 may be substantially the same as the lower mold insulating layers ILD1 and the lower dummy patterns DP1, respectively.

In some embodiments, the upper mold structure MS2 and the upper dummy stacked structure DST2 may be formed by using the same process. For example, the upper mold structure MS2 and the upper dummy stacked structure DST2 may be simultaneously formed. For example, the upper dummy patterns DP2 of the upper dummy stacked structure DST2 may include the same material as the upper sacrificial layers HL2 of the upper mold structure MS2. For example, the upper mold structure MS2 and the upper dummy stacked structure DST2 may be formed at the same vertical level.

Figure 9D:
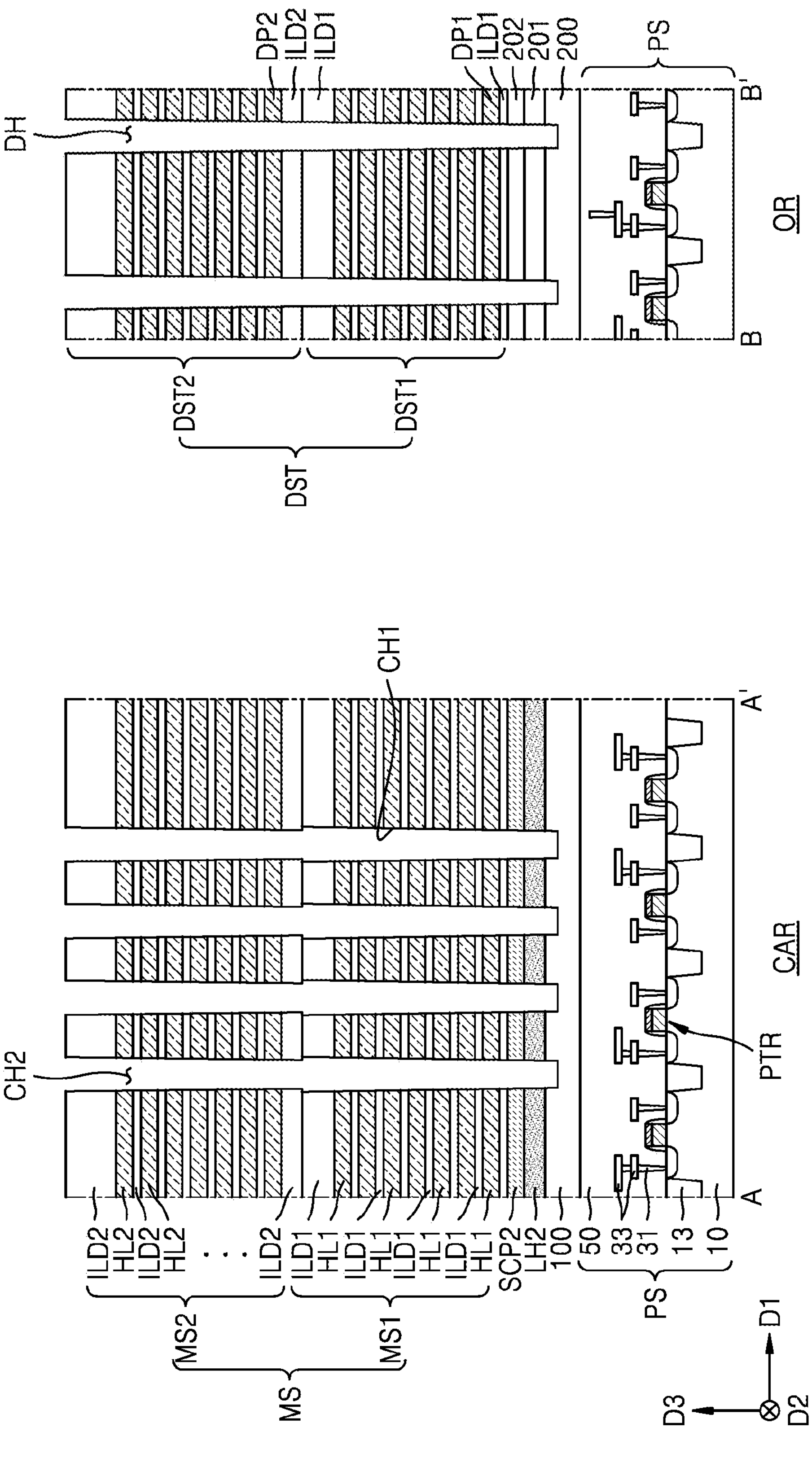

Referring to FIG. 9D, the upper channel hole CH2 penetrating the upper mold structure MS2 of the cell region CAR may be formed, and the lower channel mold CHM filling the lower channel hole CH1 penetrating the lower mold structure MS1 may be removed. The lower and upper mold insulating layers ILD1 and ILD2, the lower and upper sacrificial layers HL1 and HL2, the second horizontal pattern SCP2, the sacrificial layer LH2, and the cell substrate 100 may be exposed by inner side surfaces of the upper channel hole CH2 and the lower channel hole CH1. As described above, the upper channel hole CH2 and the lower channel hole CH1 may have a step at a boundary thereof.

At the same time, the hole DH penetrating the dummy stacked structure DST of the outside region OR may be formed. The lower and upper mold insulating layers ILD1 and ILD2 and the lower and upper dummy patterns DP1 and DP2 may be exposed by the inner side surface of the hole DH. The hole DH may not completely penetrate the insulating substrate 200, and may not expose the peripheral circuit insulating layer 50. As described above, the hole DH may not have a step at a boundary of the upper dummy stacked structure DST2 and the lower dummy stacked structure DST1.

Figure 9E:
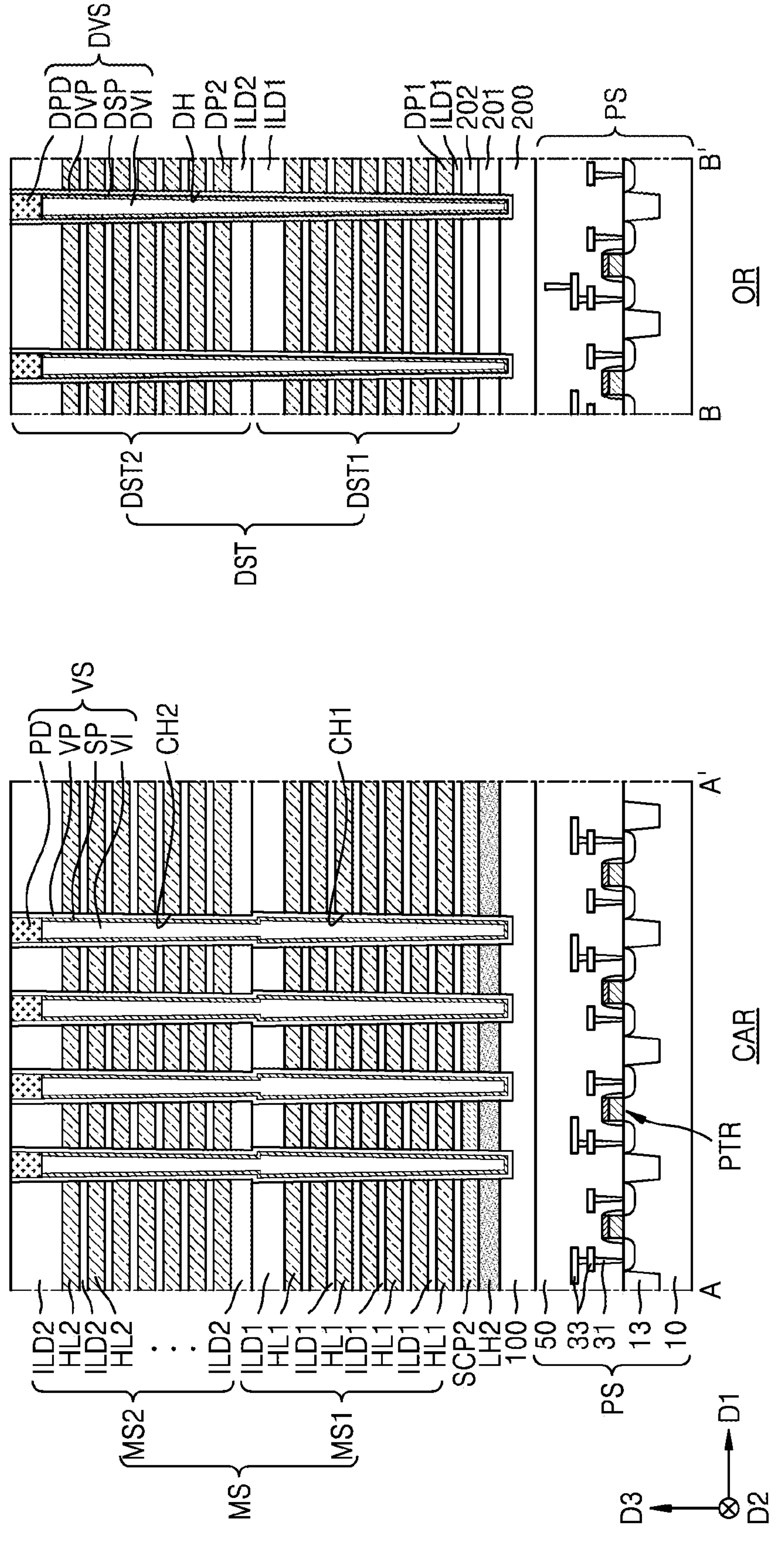

Referring to FIG. 9E, the channel structure VS may be formed in the upper channel hole CH2 and the lower channel hole CH1 of the cell region CAR. The channel insulating pattern VP may be conformally formed in the upper channel hole CH2 and the lower channel hole CH1. The channel semiconductor pattern SP may be conformally formed on the channel insulating pattern VP. The buried insulating pattern VI filling the upper channel hole CH2 and the lower channel hole CH1 may be formed on the channel semiconductor pattern SP. The conductive pad PD may be formed on the buried insulating pattern VI and the channel semiconductor pattern SP.

At the same time, the dummy vertical structure DVS may be formed in the hole DH of the outside region OR. The dummy gate dielectric layer DVP may be conformally formed in the hole DH. The dummy channel layer DSP may be conformally formed on the dummy gate dielectric layer DVP. The dummy channel buried insulating layer DVI filling the hole DH may be formed on the dummy channel layer DSP. The dummy channel pad DPD may be formed on the dummy channel buried insulating layer DVI and the dummy channel layer DSP.

In some embodiments, the channel structure VS and the dummy vertical structure DVS may be formed by using the same process. For example, the channel structure VS and the dummy vertical structure DVS may be simultaneously formed. For example, the channel insulating pattern VP of the channel structure VS, the channel semiconductor pattern SP, the buried insulating pattern VI and the conductive pad PD may include the same material as the dummy gate dielectric layer DVP of the dummy vertical structure DVS, the dummy channel layer DSP, and the dummy channel buried insulating layer DVI and the dummy channel pad DPD, respectively. For example, an upper surface of the channel structure VS and the upper surface of the dummy vertical structure DVS may be formed at the same vertical level.

Figure 9F:
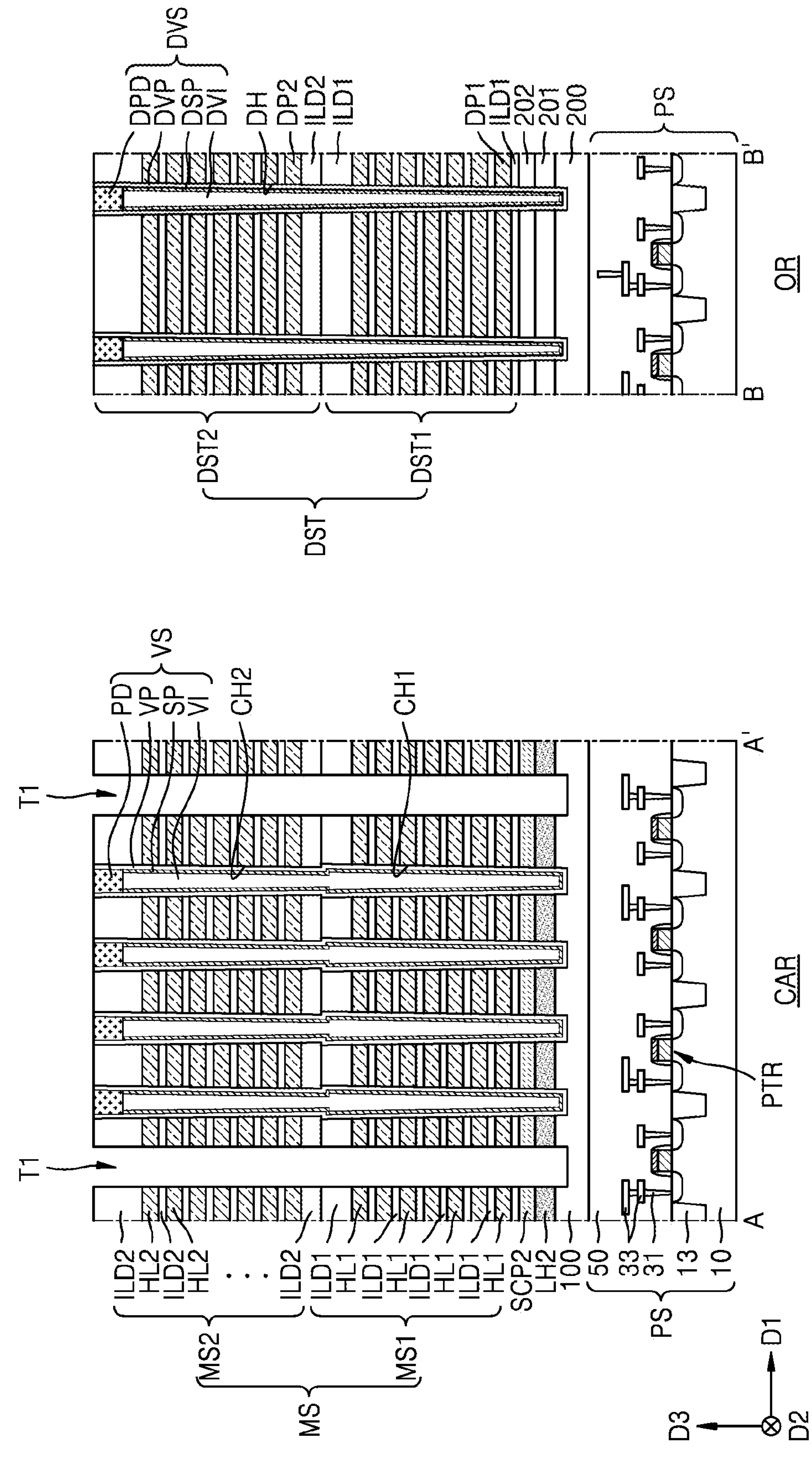

Referring to FIG. 9F, first trenches T1 crossing a mold structure MS of the cell region CAR in the second horizontal direction D2 may be formed. Forming the first trench T1 may include forming a mask layer exposing a portion of the mold structure MS on the upper surface of the mold structure MS, and etching the mold structure MS by using the mask layer as an etching mask. In some embodiments, the first trench T1 may be formed simultaneously with the upper channel hole CH2 and the hole DH.

In some embodiments, the sacrificial layer LH2 may be replaced with the first horizontal pattern SCP1, and may form the source structure SC.

Figure 9G:
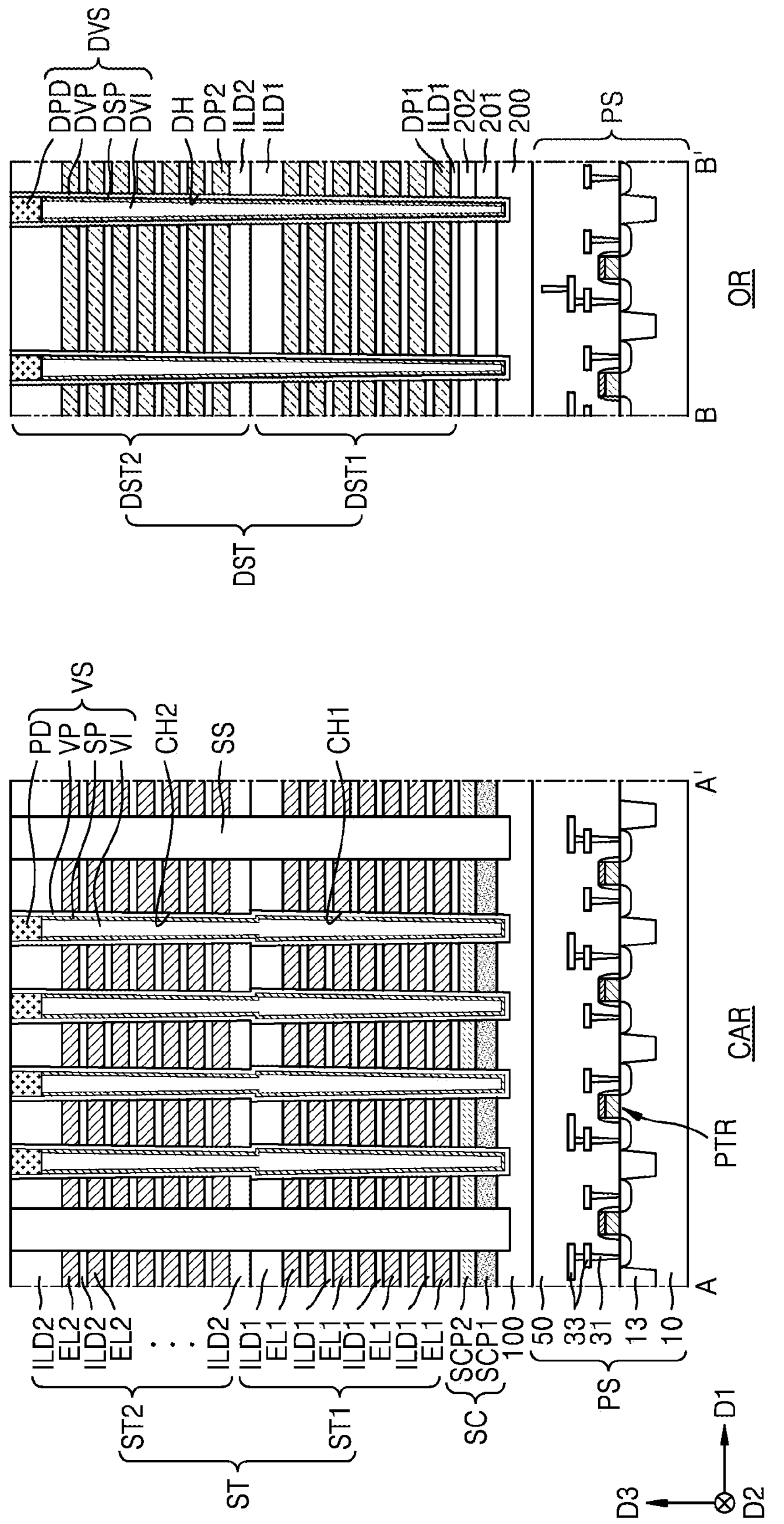

Referring to FIG. 9G, by replacing the lower and upper sacrificial layers HL1 and HL2 exposed by the first trenches T1 in the cell region CAR with the lower and upper electrodes EL1 and EL2, respectively, the electrode structure ST may be formed. The lower and upper sacrificial layers HL1 and HL2 exposed via the first trenches T1 may be selectively removed. The lower and upper electrodes EL1 and EL2 may be formed in spaces, from which the lower and upper sacrificial layers HL1 and HL2 are removed, respectively. An isolation structure SS may be formed in the first trench T1. Forming the isolation structure SS may include completely filling the first trench T1 with an insulating material, and performing a planarization process on the electrode structure ST. The mask layer may be removed also while the planarization process is performed. In this manner, the upper surface of the isolation structure SS may be at the same vertical level as the upper surface of the channel structure VS. In some embodiments, the upper surface of the isolation structure SS may be at the same vertical level as the upper surface of the dummy vertical structure DVS. In this case, the lower and upper dummy patterns DP1 and DP2 of the outside structure OS of the outside region OR may not be replaced with electrodes. As a result, in the final semiconductor device, the lower and upper dummy patterns DP1 and DP2 may form the dummy stacked structure DST together with the lower and upper mold insulating layers ILD1 and ILD2, respectively.

The planarization process may simultaneously planarize the electrode structure ST of the cell region CAR and the dummy stacked structure DST of the outside region OR. In the planarization process, a plurality of dummy vertical structures DVS arranged in the outside region OR may serve to mark an etching stop in the outside region OR. In addition, it may be possible to improve the phenomenon, in which the dummy stacked structure DST is etched more than intended or the dummy stacked structure DST is sunk during the planarization process by the plurality of dummy vertical structures DVS arranged in the outside region OR.

Accordingly, a semiconductor device and an electronic system including the plurality of dummy vertical structures DVS may be provided according to embodiments of inventive concepts. A semiconductor device and an electronic system having improved reliability and the degree of integration may be provided according to embodiments of inventive concepts.

Figure 9H:
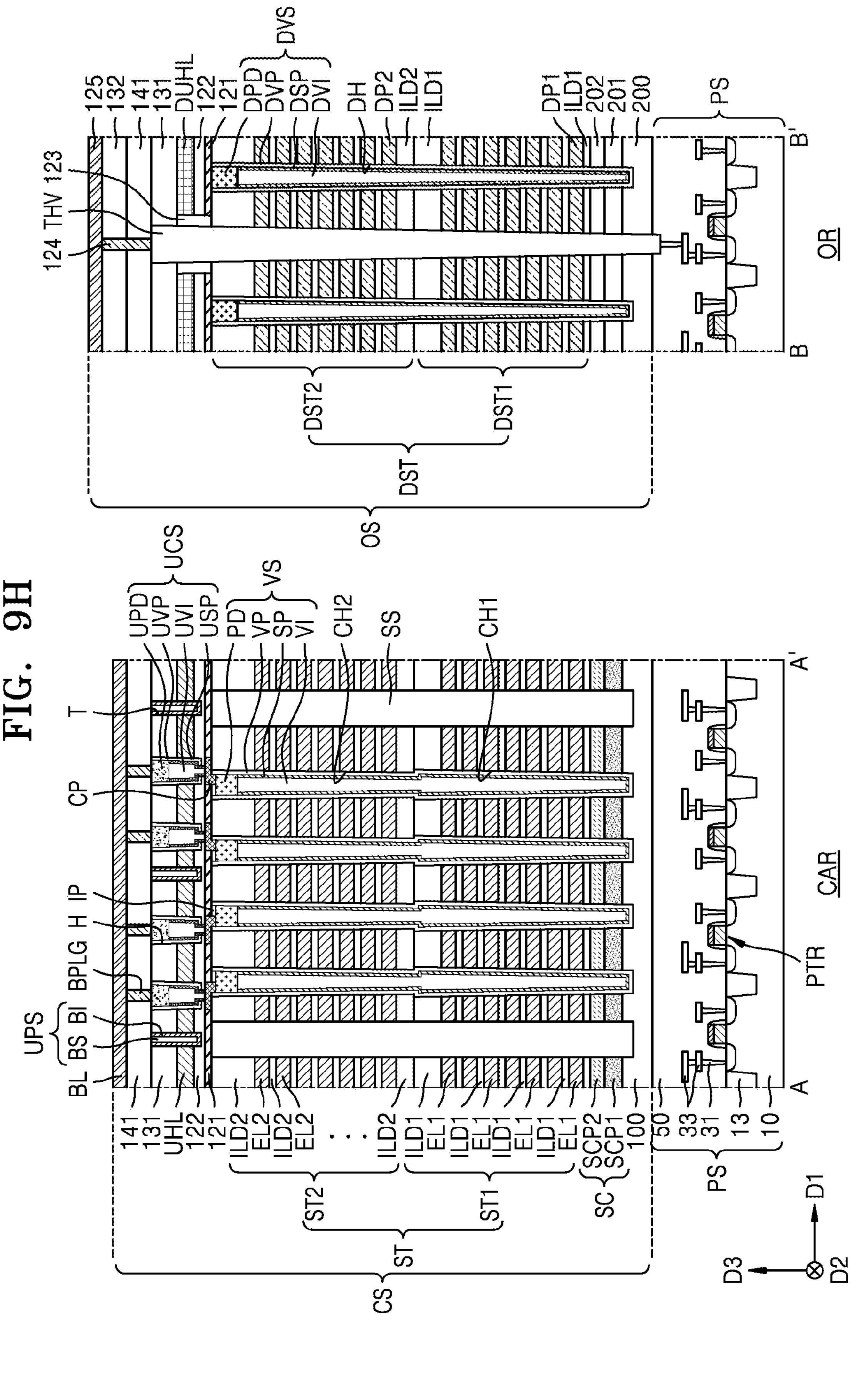

Referring to FIG. 9H, the first insulating layer 121, the second insulating layer 122, the upper horizontal electrode UHL, and the first interlayer insulating layer 131 may be sequentially formed on the electrode structure ST of the cell region CAR. By removing portions of the first insulating layer 121, the second insulating layer 122, the upper horizontal electrode UHL, and the first interlayer insulating layer 131, the capping patterns IP may be formed between the first insulating layer 121 and the pads PDs of the channel structures VS. The conductive pattern CP connected to the channel structure VS and the upper channel structure UCS penetrating the upper horizontal electrode UHL and connected to the conductive pattern CP may be formed. The upper separation patterns UPSs crossing the upper horizontal electrode UHL in the second horizontal direction D2 may be formed.

The first insulating layer 121, the second insulating layer 122, the dummy upper horizontal electrode DUHL, and the first interlayer insulating layer 131 may be sequentially formed on the dummy stacked structure DST of the outside region OR. The insulating ring 123 may be formed by etching portions of the first insulating layer 121, the second insulating layer 122, and the dummy upper horizontal electrode DUHL. The through electrode THV penetrating the first interlayer insulating layer 131, the dummy upper horizontal electrode DUHL, the first insulating layer 121, the second insulating layer 122, the dummy stacked structure DST, the third insulating layer 201, and the fourth insulating layer 202 may be formed. The second interlayer insulating layer 141, the third interlayer insulating layer 132, and the wiring layer 125 may be formed on the first interlayer insulating layer 131, and the contact 124 penetrating the second interlayer insulating layer 141 and the third interlayer insulating layer 132 may be formed. The through electrode THV may be electrically connected to the wiring layer 125 by using the contact 124.

Although a manufacturing method of the semiconductor device 10 of FIGS. 5 and 7A has been described above, one of ordinary skill in the art may easily reach a semiconductor device illustrated in FIGS. 6A through 6D, and 8A through 8C in substantially the same manner based on the descriptions above.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. A semiconductor device comprising:

a peripheral circuit structure including a cell region and an outside region;

a cell structure on the cell region of the peripheral circuit structure;

an outside structure on the outside region of the peripheral circuit structure; and an insulating layer on the peripheral circuit structure, wherein the cell structure includes an electrode structure including electrodes alternately arranged on the cell region, a channel structure penetrating the electrode structure, a conductive pattern connected to the channel structure, an upper horizontal electrode on the electrode structure and the conductive pattern, and an upper semiconductor pattern penetrating the upper horizontal electrode and connected to the conductive pattern, the outside structure includes a dummy stacked structure, a through electrode penetrating the dummy stacked structure and connected to the peripheral circuit structure, and a dummy vertical structure adjacent to the through electrode and penetrating at least a portion of the dummy stacked structure, the dummy stacked structure includes an upper dummy stacked structure on a lower dummy stacked structure, the upper dummy stacked structure includes upper dummy patterns stacked on the lower dummy stacked structure, the lower dummy stacked structure includes lower dummy patterns stacked on the outside region, the insulating layer between the dummy stacked structure and the peripheral circuit structure, and at least a portion of the insulating layer is between the dummy vertical structure and the peripheral circuit structure, wherein an upper surface of the dummy vertical structure has a rounded shape in a plan view.

2. The semiconductor device of claim 1, wherein a lower surface of the dummy vertical structure is between a lower surface of the lower dummy stacked structure and an upper surface of the lower dummy stacked structure.

3. The semiconductor device of claim 1, wherein a lower surface of the dummy vertical structure is between a lower surface of the upper dummy stacked structure and an upper surface of the upper dummy stacked structure.

4. The semiconductor device of claim 1, wherein a vertical height of the dummy vertical structure is equal to or less than a vertical height of the channel structure.

5. The semiconductor device of claim 1, wherein a vertical level of a lower surface of the dummy vertical structure is equal to or greater than a vertical level of a lower surface of the channel structure.

6. The semiconductor device of claim 1, wherein the upper surface of the dummy vertical structure is level with an upper surface of the channel structure.

7. The semiconductor device of claim 1, wherein the dummy vertical structure is not electrically connected to the peripheral circuit structure.

8. The semiconductor device of claim 1, wherein the peripheral circuit structure comprises a peripheral circuit board and a peripheral circuit insulating layer on the peripheral circuit board, in the cell region, the peripheral circuit insulating layer contacts a cell substrate, and in the outside region, the peripheral circuit insulating layer contacts the insulating layer.

9. The semiconductor device of claim 1, wherein the dummy vertical structure comprises:

a dummy gate dielectric layer contacting the dummy stacked structure;

a dummy channel layer on the dummy gate dielectric layer;

a dummy channel buried insulating layer surrounded by the dummy channel layer; and a dummy channel pad on the dummy channel layer and the dummy channel buried insulating layer.

10. The semiconductor device of claim 1, wherein the cell structure further comprises a first insulating layer covering the channel structure on the electrode structure, the conductive pattern penetrates the first insulating layer and is connected to the channel structure, and the upper horizontal electrode is on the first insulating layer.

11. A semiconductor device comprising:

a peripheral circuit structure including a cell region and an outside region;

a cell structure on the cell region of the peripheral circuit structure;

an outside structure on the outside region of the peripheral circuit structure; and an insulating layer on the peripheral circuit structure, wherein the cell structure includes a cell substrate, a lower electrode structure on the cell substrate, an upper electrode structure on the lower electrode structure, a channel structure penetrating the lower electrode structure and the upper electrode structure, an upper horizontal electrode on the channel structure, and an upper semiconductor pattern penetrating the upper horizontal electrode, the lower electrode structure includes a lower electrode and a lower mold insulating layer alternately stacked in the cell structure, the upper electrode structure includes an upper electrode and an upper mold insulating layer alternately stacked on the lower electrode structure, the upper semiconductor pattern is connected to the channel structure, the outside structure includes a lower dummy stacked structure, an upper dummy stacked structure, a through electrode penetrating the upper dummy stacked structure and the lower dummy stacked structure, and a plurality of dummy vertical structures surrounding the through electrode, and the lower dummy stacked structure is level with the lower electrode structure, the lower dummy stacked structure includes the lower mold insulating layer and a lower dummy pattern alternately stacked, the upper dummy stacked structure is level with the upper electrode structure, the upper dummy stacked structure includes the upper mold insulating layer and an upper dummy pattern alternately stacked, the through electrode is connected to the peripheral circuit structure, the plurality of dummy vertical structures penetrate a portion of the upper dummy stacked structure, in a plan view, the insulating layer is between the lower dummy stacked structure and the peripheral circuit structure, at least a portion of the insulating layer is between the plurality of dummy vertical structures and the peripheral circuit structure, wherein an upper surface of each of the plurality of dummy vertical structures has a rounded shape in a plan view.

12. The semiconductor device of claim 11, wherein an upper surface of the through electrode is at a higher vertical level than the upper surface of each of the plurality of dummy vertical structures.

13. The semiconductor device of claim 11, wherein a lower surface of the through electrode is at a lower vertical level than a lower surface of each of the plurality of dummy vertical structures.

14. The semiconductor device of claim 11, wherein a sidewall of the channel structure has a step at a boundary of the lower electrode structure and the upper electrode structure, and sidewalls of the plurality of dummy vertical structures do not have a step at the boundary of the lower dummy stacked structure and the upper dummy stacked structure.

15. The semiconductor device of claim 11, wherein the plurality of dummy vertical structures and the through electrode do not overlap the cell substrate in a vertical direction.

16. The semiconductor device of claim 11, wherein upper surfaces of the plurality of dummy vertical structures are level with an upper surface of the channel structure.

17. The semiconductor device of claim 11, wherein the cell structure further includes a first insulating layer covering the channel structure and on the upper electrode structure, a capping pattern between the first insulating layer and the channel structure, and a conductive pattern penetrating the first insulating layer and the capping pattern, the conductive pattern is connected to the channel structure, and the upper semiconductor pattern is connected to the channel structure via the conductive pattern.

18. An electronic system comprising:

a main substrate;

a semiconductor device on the main substrate; and a controller electrically connected to the semiconductor device on the main substrate, wherein the semiconductor device includes a peripheral circuit structure including a cell region and an outside region, a cell structure on the cell region of the peripheral circuit structure, an outside structure on the outside region of the peripheral circuit structure, and an insulating layer on the peripheral circuit structure, the cell structure includes an electrode structure including electrodes alternately arranged on the cell region, a channel structure penetrating the electrode structure, a conductive pattern connected to the channel structure, an upper horizontal electrode on the electrode structure and the conductive pattern, and an upper semiconductor pattern penetrating the upper horizontal electrode, the upper semiconductor pattern is connected to the conductive pattern, the outside structure includes a dummy stacked structure, a through electrode penetrating the dummy stacked structure and connected to the peripheral circuit structure, and a plurality of dummy vertical structures adjacent to the through electrode and penetrating at least a portion of the dummy stacked structure, the dummy stacked structure includes an upper dummy stacked structure on a lower dummy stacked structure, the upper dummy stacked structure includes upper dummy patterns stacked on the lower dummy stacked structure, the lower dummy stacked structure includes lower dummy patterns stacked on the outside region, the insulating layer is between the dummy stacked structure and the peripheral circuit structure, and at least a portion of the insulating layer is between the plurality of dummy vertical structures and the peripheral circuit structure, wherein an upper surface of each of the plurality of dummy vertical structures has a rounded shape in a plan view.

19. The electronic system of claim 18, wherein the plurality of dummy vertical structures surround the through electrode in a plan view.

20. The electronic system of claim 18, wherein the peripheral circuit structure comprises a peripheral circuit board and a peripheral circuit insulating layer on the peripheral circuit board, in the cell region, the peripheral circuit insulating layer contacts a cell substrate, and in the outside region, the peripheral circuit insulating layer contacts the insulating layer.

* * * * *